United States Patent
Koizumi et al.

(10) Patent No.: US 11,279,875 B2
(45) Date of Patent: Mar. 22, 2022

(54) NITRIDE PHOSPHOR AND METHOD FOR PRODUCING NITRIDE PHOSPHOR

(71) Applicant: Mitsubishi Chemical Corporation, Chiyoda-ku (JP)

(72) Inventors: Ryo Koizumi, Chiyoda-ku (JP); Yuhei Inata, Chiyoda-ku (JP); Saiko Kiyohara, Chiyoda-ku (JP); Masahito Isaka, Chiyoda-ku (JP); Naoyuki Komuro, Chiyoda-ku (JP); Kohei Matsuda, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 81 days.

(21) Appl. No.: 16/743,100

(22) Filed: Jan. 15, 2020

(65) Prior Publication Data

US 2020/0148947 A1 May 14, 2020

Related U.S. Application Data

(63) Continuation of application No. PCT/JP2018/026946, filed on Jul. 18, 2018.

(30) Foreign Application Priority Data

Jul. 19, 2017 (JP) .............................. JP2017-139989
Mar. 20, 2018 (JP) .............................. JP2018-052401

(51) Int. Cl.
| | |
|---|---|
| *C09K 11/08* | (2006.01) |
| *C01B 21/097* | (2006.01) |
| *C09K 11/77* | (2006.01) |
| *H01L 33/50* | (2010.01) |

(52) U.S. Cl.
CPC ........ *C09K 11/0883* (2013.01); *C01B 21/097* (2013.01); *C09K 11/77746* (2021.01); *C09K 11/77747* (2021.01); *C09K 11/77748* (2021.01); *C09K 11/77926* (2021.01); *C09K 11/77927* (2021.01); *C09K 11/77928* (2021.01); *H01L 33/502* (2013.01)

(58) Field of Classification Search
CPC ...... C09K 11/77746; C09K 11/777927; C09K 11/777926; C09K 11/777928; C09K 11/77747; C09K 11/77748
See application file for complete search history.

(56) References Cited

U.S. PATENT DOCUMENTS

| | | |
|---|---|---|
| 2010/0085728 A1 | 4/2010 | Seto et al. |
| 2012/0256533 A1 | 10/2012 | Seto et al. |
| 2013/0234588 A1 | 9/2013 | Seto et al. |
| 2014/0042898 A1 | 2/2014 | Seto et al. |
| 2014/0246623 A1* | 9/2014 | Takashina .......... C09K 11/0883 252/301.4 F |
| 2016/0040063 A1 | 2/2016 | Shimooka et al. |
| 2018/0305243 A1 | 10/2018 | Kadomi et al. |

FOREIGN PATENT DOCUMENTS

| | | |
|---|---|---|
| JP | 2009-249445 A | 10/2009 |
| JP | 2013-056826 A | 3/2013 |
| JP | 2013-127061 A | 6/2013 |
| JP | 2016-121300 A | 7/2016 |
| JP | 2017-088781 A | 5/2017 |
| WO | WO 2008/132954 A1 | 11/2008 |
| WO | WO 2010/114061 A1 | 10/2010 |
| WO | WO 2013/073598 A1 | 5/2013 |
| WO | WO 2014/123198 A1 | 8/2014 |
| WO | WO 2015/025570 A1 | 2/2015 |
| WO | WO 2018/003848 A1 | 1/2018 |

OTHER PUBLICATIONS

International Search Report dated Oct. 2, 2018 in PCT/JP/2018/026946 filed on Jul. 18, 2018, citing documents AE-AF, AN, AP-AV & AX therein, 3 pages.

Du, F, et al., "Synthesis, structure and luminescent properties of yellow phosphor $La_3Si_6N_{11}:Ce^{3+}$ for high power white-LEDs", Journal of Rare Earths, 2017, vol. 35, pp. 1059-1064.

English translation of the International Preliminary Report on Patentability and Written Opinion of the International Searching Authority dated Jan. 30, 2020 in PCT/JP2018/026946, 10 pages.

* cited by examiner

*Primary Examiner* — C Melissa Koslow
(74) *Attorney, Agent, or Firm* — Oblon, McClelland, Maier & Neustadt, L.L.P.

(57) ABSTRACT

Provided is a nitride phosphor having two or more maximum absorption points in a range of 3,200 to 3,300 cm$^{-1}$ in an infrared absorption (FT-IR) spectrum. The nitride phosphor of the present invention has excellent emission characteristics and is highly reliable when used in devices.

20 Claims, 9 Drawing Sheets

NITRIDE PHOSPHOR AND METHOD FOR PRODUCING NITRIDE PHOSPHOR

CROSS-REFERENCE TO RELATED APPLICATION

This is a continuation of International Application PCT/JP2018/026946, filed on Jul. 18, 2018, and designated the U.S., and claims priority from Japanese Patent Application 2017-139989 which was filed on Jul. 19, 2017 and Japanese Patent Application 2018-052401 which was filed on Mar. 20, 2018, the entire contents of which are incorporated herein by reference.

TECHNICAL FIELD

The present invention relates to: a nitride phosphor; a liquid medium containing the nitride phosphor; a light-emitting device including the nitride phosphor; a lighting apparatus including the light-emitting device; and a method of producing a phosphor.

BACKGROUND ART

With the recent trend of energy conservation, there is an increasing demand for lightings and backlights that use LEDs. The LEDs used for such applications are white light-emitting LEDs in which phosphors are disposed on an LED chip that emits a light of a blue or near-ultraviolet wavelength. As white light-emitting LEDs of such a type, LEDs in which YAG (yttrium-aluminum-garnet) phosphors which emit a yellow color using a blue light emitted from a blue LED chip as an excitation light and are disposed on the blue LED chip are often used.

However, YAG phosphors have problems in that, when used under a high-output condition, so-called temperature quenching where an increase in the phosphor temperature causes a reduction in brightness is prominent, and that the brightness is markedly reduced when they are excited with a near-ultraviolet light (as a term for blue excitation, a range including purple wavelengths of about 350 to 420 nm is usually referred to as "near-ultraviolet light") for the sake of a broader color reproduction range and superior color rendering properties.

In order to solve the above-described problems, yellow light-emitting nitride phosphors have been examined and, as strong candidates thereof, for example, the $La_3Si_6N_{11}$ phosphors described in Patent Documents 1 and 2 (phosphors of this type are hereinafter collectively referred to as "LSN phosphors", including those in which lanthanum is replaced with other metal) have been developed.

In addition, Patent Documents 3 and 4 describe that, by treating an LSN phosphor at a relatively low temperature of 50 to 300° C. under a high-humidity condition for the purpose of improving the brightness of the LSN phosphor, a film of physically/chemically adsorbed water was formed on the phosphor surface and an LSN phosphor having an excellent emission intensity was thereby obtained.

PRIOR ART DOCUMENTS

Patent Documents

Patent Document 1: WO 2008/132954
Patent Document 2: WO 2010/114061
Patent Document 3: WO 2013/073598
Patent Document 4: WO 2015/025570

SUMMARY OF THE INVENTION

Problems to be Solved by the Invention

In recent years, phosphors for LEDs are expected to have both of the following characteristics: an emission efficiency allowing to covert an LED light into another color with a higher efficiency; and such long-term reliability that can maintain the initial properties as long as possible in an LED package assumed to be used over a long period of time.

However, the LSN phosphors disclosed in Patent Documents 1 to 4 have a problem in that, in terms of both brightness and reliability, they are not adequate as phosphors to be used in a light-emitting device under high-output conditions.

According to the studies conductive by the present inventors, although LSN phosphors using the brightness-improving method described in the reference documents 3 and 4 have been confirmed to exhibit high brightness as phosphors, it was discovered that these LSN phosphors have a problem in that their brightness decreases with time when used in a light-emitting device, causing a change in emission chromaticity of an LED package. Such phosphors are poor in reliability and thus not preferred as phosphors for LEDs the are used over a longer period as compared to conventional light-emitting devices such as cold-cathode tubes (CCFL).

The present invention was made in view of these problems, and an object of the present invention is to provide a phosphor that has excellent emission characteristics and is highly reliable when used in devices.

Means for Solving the Problems

The present inventors intensively studied to solve the above-described problems and consequently discovered that a treatment of a nitride phosphor by a method different from a conventional method allows the nitride phosphor to solve the above-described problems, thereby arriving at first and second inventions.

That is, the gist of the present invention resides in the following <1> to <16>.

<1> A nitride phosphor having two or more maximum absorption points in a range of 3,200 to 3,300 cm$^{-1}$ in an infrared absorption (FT-IR) spectrum.

<2> The nitride phosphor according to <1>, having a maximum absorption point in two or more ranges of 3,220 to 3,250 cm$^{-1}$, 3,255 to 3,275 cm$^{-1}$, and 3,280 to 3,300 cm$^{-1}$.

<3> The nitride phosphor according to <1> or <2>, containing a crystal phase that has a chemical composition represented by the following Formula (1):

$$M1_xM2_yM3_z:M4 \qquad (1)$$

wherein

M1 represents at least one element selected from the group consisting of Y, La, Gd and Lu;

M2 represents at least one element selected from the group consisting of Ge, Si, Hf, Zr, Al, Ga and Ti;

M3 contains N as an essential element and represents at least one element selected from the group consisting of N, O, F and Cl;

M4 represents at least one activation element selected from the group consisting of Eu, Ce, Pr, Cr, Nd, Sm, Tb, Dy, Ho, Er, Tm, Yb and Mn;

x satisfies 2.0≤x≤4.0;
y satisfies 5.0≤y≤7.0; and
z satisfies 10.0≤z≤12.0.

<4> The nitride phosphor according to <3>, wherein in Formula (1), M1 is at least one element selected from the group consisting of Y, La and Gd, and M2 contains Si as an essential element.

<5> The nitride phosphor according to <3> or <4>, wherein in Formula (1), x satisfies 2.7≤x≤3.3, and y satisfies 5.4≤y≤6.6.

<6> The nitride phosphor according to any one of <1> to <5>, having a maximum absorption point in a range of 3,720 to 3,760 cm$^{-1}$ in the infrared absorption (FT-IR) spectrum.

<7> A nitride phosphor containing a crystal phase that has a chemical composition represented by the following Formula (2), wherein when the value of a difference between a minimum ionic strength and a maximum ionic strength in a range of 200 to 400° C. in a detection chart for a molecular weight (m/z) of 44 measured by TPD-MS analysis is defined as 1, the value of a difference between a minimum ionic strength and a maximum ionic strength in a range of 500 to 650° C. is 0.5 or larger:

$$M_p Si_q N_r Z \qquad (2)$$

wherein

M represents a rare-earth element, excluding an element used as an activator;

Z represents the activator;

p satisfies 2.7≤p≤3.3;

q satisfies 5.4≤q≤6.6; and r satisfies 10≤r≤12.

<8> The nitride phosphor according to <7>, wherein the value of the difference between the minimum ionic strength and the maximum ionic strength in the range of 500 to 650° C. is 2.0 or larger.

<9> The nitride phosphor according to <7> or <8>, wherein in Formula (2), M is at least one element selected from the group consisting of La, Y, Gd and Lu.

<10> The nitride phosphor according to any one of <7> to <9>, wherein the nitride phosphor has a relative brightness of 130 or higher when a Y value in an XYZ color system of a YAG phosphor excited with a light having a wavelength of 455 nm is defined as a reference value of 100, and wherein the absolute value of an amount of change (Δy) in the value of chromaticity y after energizing the nitride phosphor used in a semiconductor light-emitting device in an environment of 85° C. and 85% RH and illuminating the nitride phosphor for 100 hours with respect to a value of chromaticity y at the initiation of illumination is 0.003 or smaller.

<11> The nitride phosphor according to any one of <3> to <10>, wherein the crystal phase that has the chemical composition represented by Formula (1) or (2) is a tetragonal crystal.

<12> A method of producing a nitride phosphor containing a crystal phase that has a chemical composition represented by the following Formula (2), wherein the method includes:

the step of preparing a raw material mixture of the nitride phosphor containing the crystal phase that has the chemical composition represented by the following Formula (2);

the firing step of firing the raw material mixture; and the heating step of heating a fired product obtained by the firing step in an atmosphere having an oxygen content of 10,000 ppm or less, wherein the crystal phase is a tetragonal crystal or an orthorhombic crystal:

$$M_p Si_q N_r Z \qquad (2)$$

wherein

M represents a rare-earth element, excluding an element used as an activator;

Z represents the activator;

p satisfies 2.7≤p≤3.3;

q satisfies 5.4≤q≤6.6; and r satisfies 10≤r≤12.

<13> The method according to <12>, wherein in the heating step, the fired product is heated in an atmosphere having a water content of 10.0% by volume or less.

<14> The method according to <12> or <13>, wherein in the heating step, the atmosphere having an oxygen content of 10,000 ppm or less is realized by supplying a nitrogen gas and/or a noble gas into a heating furnace where heating is performed.

<15> The method according to <12> or <13>, wherein in the heating step, the atmosphere having an oxygen content of 10,000 ppm or less is realized by evacuating the inside of a heating furnace where heating is performed.

<16> A method of producing a nitride phosphor containing a crystal phase that has a chemical composition represented by the following Formula (2), wherein the method includes:

the step of preparing a raw material mixture of the nitride phosphor containing the crystal phase that has the chemical composition represented by the following Formula (2);

the firing step of firing the raw material mixture; and the heating step of heating a fired product obtained by the firing step in an atmosphere having a water content of 10.0% by volume or less, wherein the crystal phase is a tetragonal crystal:

$$M_p Si_q N_r Z \qquad (2)$$

wherein

M represents a rare-earth element, excluding an element used as an activator;

Z represents the activator;

p satisfies 2.7≤p≤3.3;

q satisfies 5.4≤q≤6.6; and r satisfies 10≤r≤12.

<17> The method according to any one of <12> to <16>, wherein in the heating step, the fired product is heated at 500° C. to 1,300° C.

<18> A light-emitting device including:

a semiconductor light-emitting element that emits a UV light or a visible light; and the nitride phosphor according to any one of <1> to <11>.

<19> A lighting apparatus including the light-emitting device according to <18> as a light source.

<20> An image display device including the light-emitting device according to <18> as a light source.

Effects of the Invention

According to the present invention, a nitride phosphor that not only has a high emission brightness but also is highly reliable with only a small reduction in brightness and a minor change in chromaticity during the long-term use can be provided. In addition, a production method that can yield a nitride phosphor having excellent emission brightness and reliability can be provided.

Figure 4:
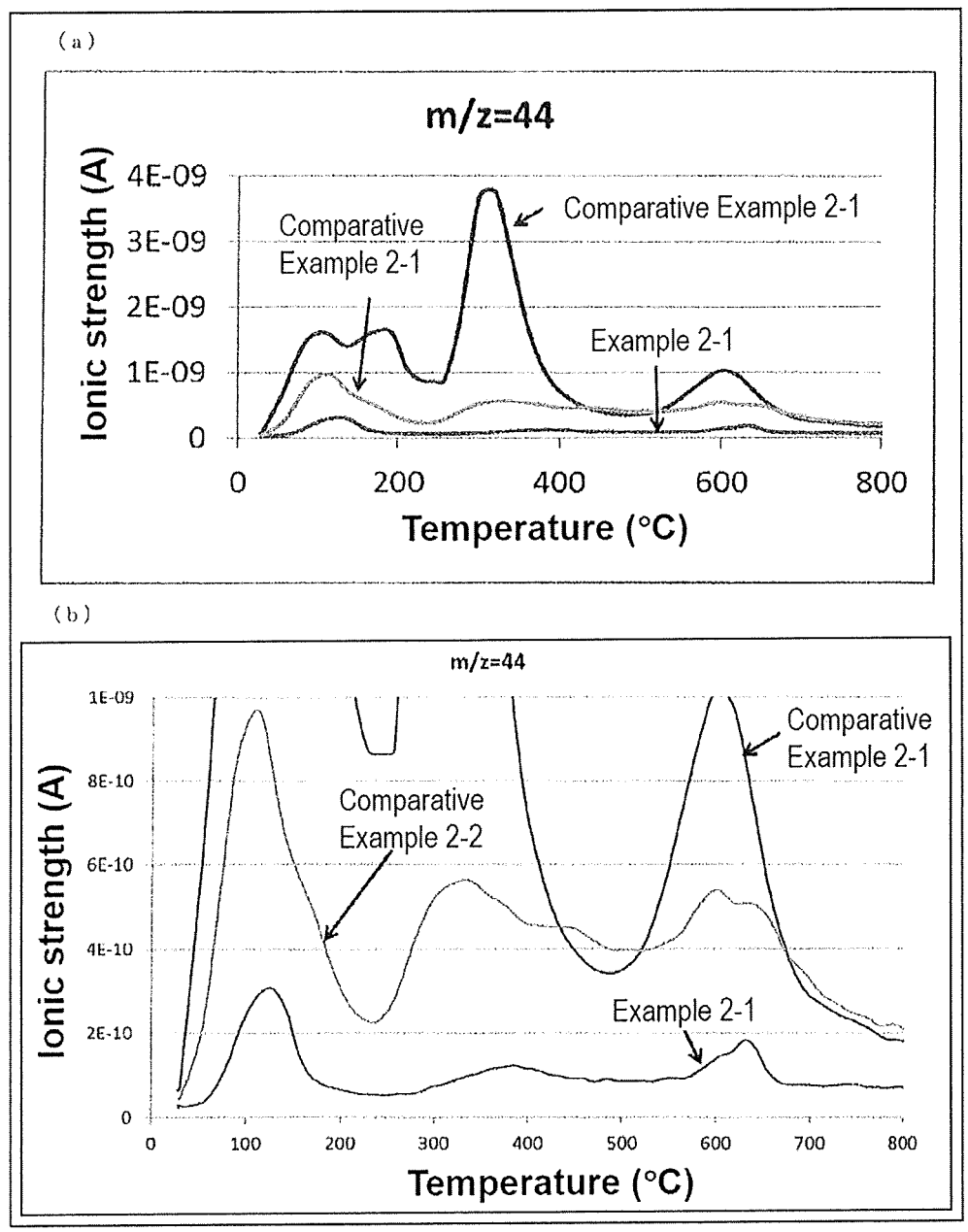

Panel (a) of FIG. 4 shows detection charts for a molecular weight (m/z) of 44 that were measured by TPD-MS analysis for the phosphors of Example 2-1 and Comparative Examples 2-1 and 2-2, and panel (b) of FIG. 4 shows an enlarged view thereof.

Figure 5:
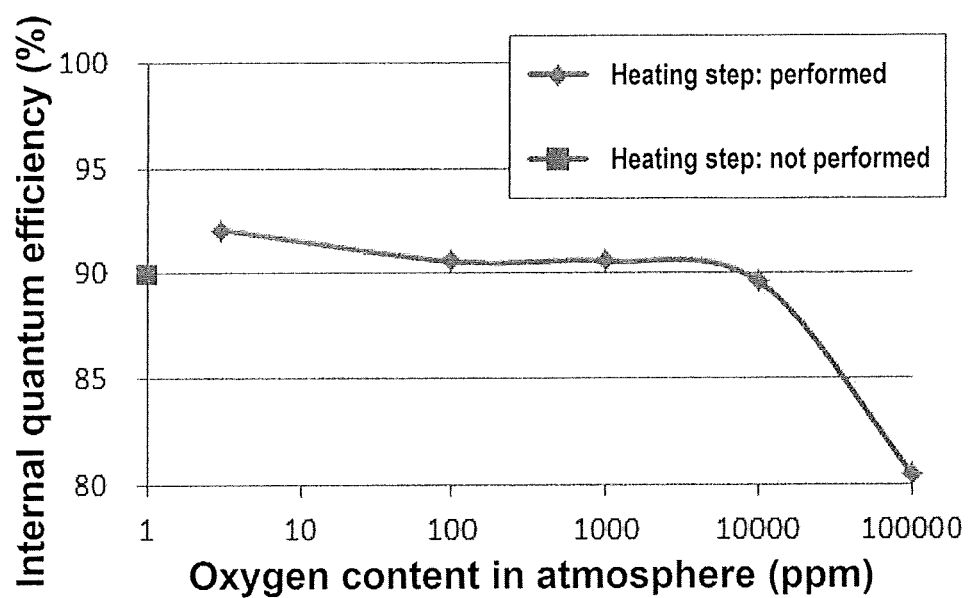

FIG. 5 is a graph showing the internal quantum efficiency values of the nitride phosphors of Examples 2-4 to 2-7 and Comparative Examples 2-1 and 2-3.

Figure 6:
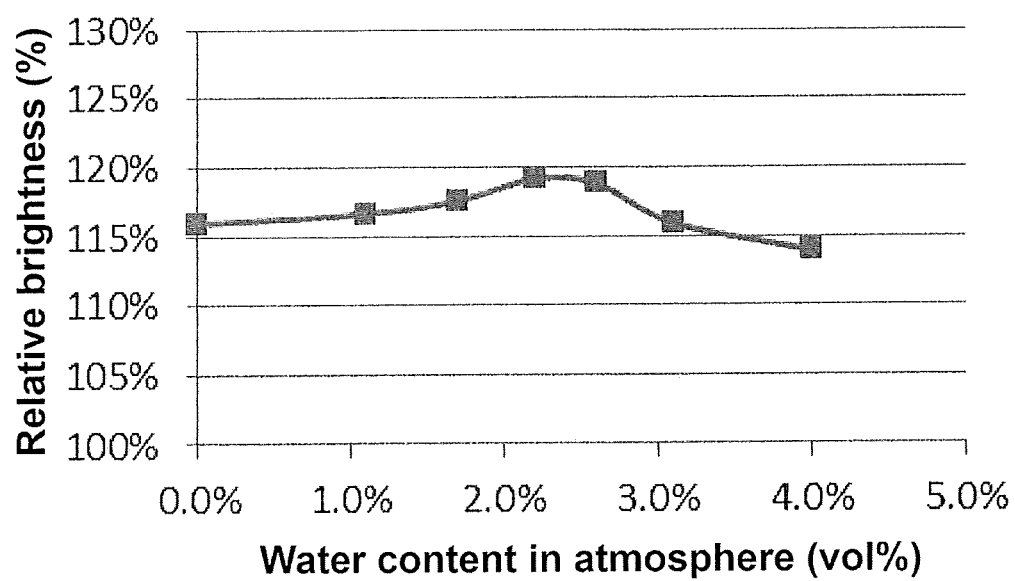

FIG. 6 is a graph showing the relative brightness values of the nitride phosphors of Examples 2-8 to 2-14.

Figure 7:
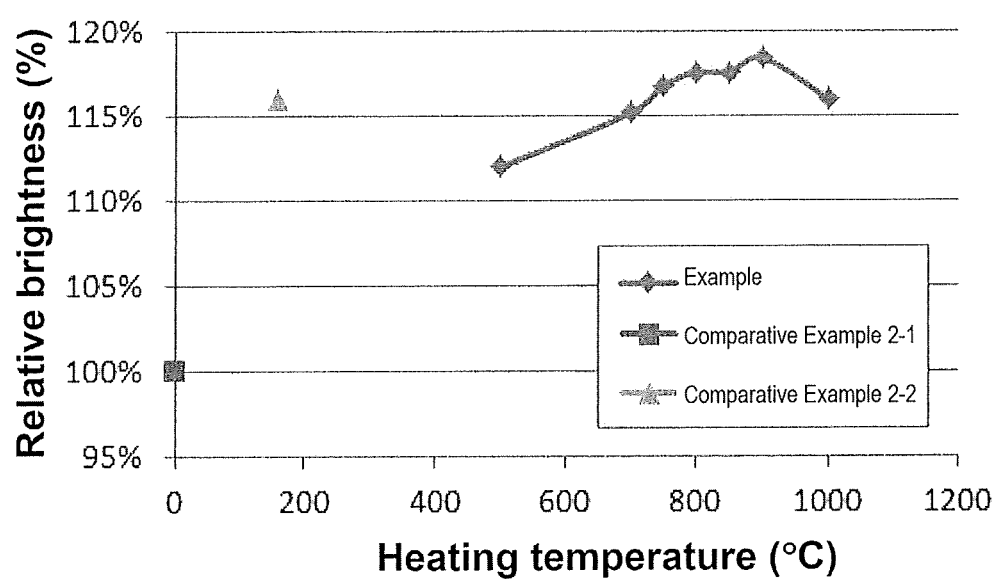

FIG. 7 is a graph showing the relative brightness values of the nitride phosphors of Examples 2-20 to 2-27 and Comparative Examples 2-1 and 2-2.

Figure 8:
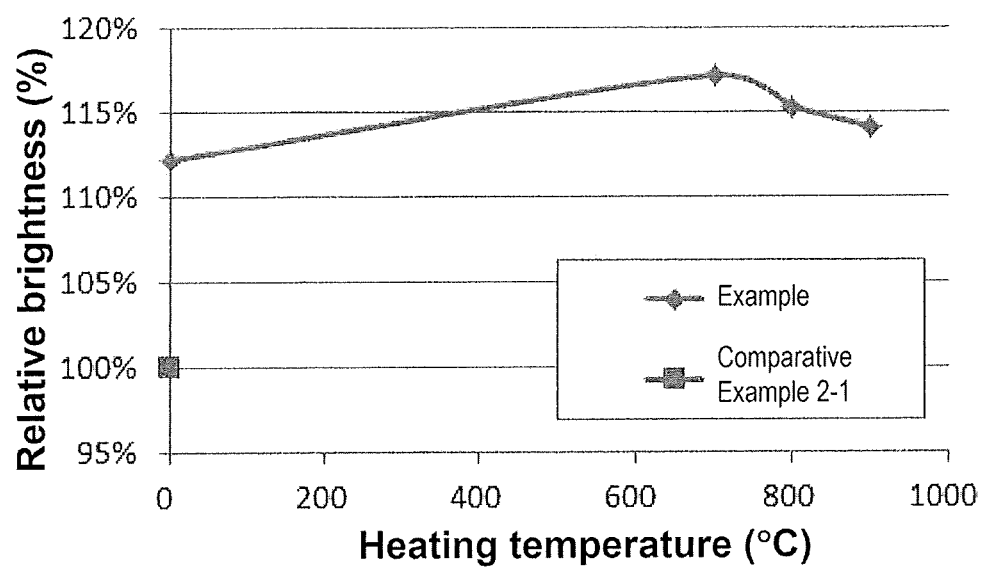

FIG. 8 is a graph showing the relative brightness values of the nitride phosphors of Examples 2-28 to 2-31 and Comparative Example 2-1.

Figure 9:
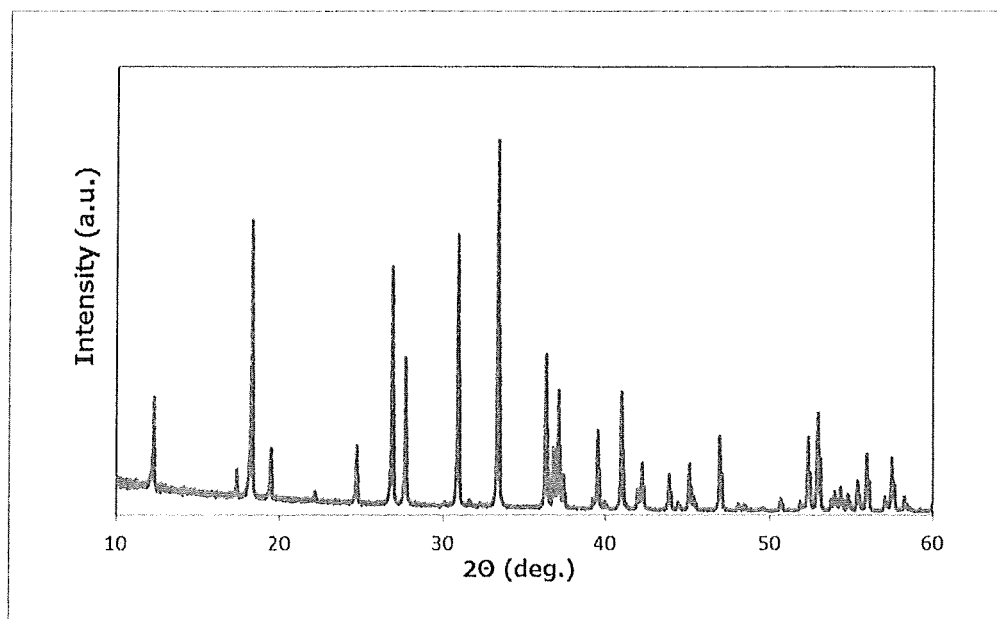

FIG. 9 is a graph showing an XRD diffraction pattern of the nitride phosphor of Example 1-5.

DESCRIPTION OF EMBODIMENTS

Embodiments of the present invention will now be described in detail. It is noted here, however, that the present invention is not restricted to the following descriptions and can be carried out with any modification within a range that does not depart from the gist of the present invention.

In the present specification, those numerical ranges expressed with "to" each denote a range that includes the numerical values stated before and after "to" as the lower and upper limit values, respectively. Further, the composition formulae of phosphors in the present specification are separated from each other by commas. Where plural elements separated by commas are enumerated in parentheses, it means that the phosphor of interest may contain one or more of the enumerated elements in any combination and any composition.

<1. Nitride Phosphor 1>

A nitride phosphor according to a first embodiment of a first invention of the present invention is a nitride phosphor having two or more maximum absorption points (absorption peaks) in a range of 3,200 to 3,300 cm$^{-1}$ in an infrared absorption (FT-IR) spectrum. Further, a nitride phosphor according to a second embodiment of the first invention of the present invention is a nitride phosphor having a maximum absorption point (absorption peak) in a range of 3,720 to 3,760 cm$^{-1}$ in the infrared absorption (FT-IR) spectrum. The nitride phosphors according to the first and the second embodiments of the first invention of the present invention may be hereinafter collectively referred to as "the nitride phosphor according to the embodiments of the first invention".

(Type of Nitride Phosphor 1)

The nitride phosphor according to the embodiments of the first invention of the present invention is not particularly restricted as long as it has the above-described characteristics in its infrared absorption (FT-IR) spectrum, and examples thereof include nitride phosphors containing (Sr, Ca)$_2$Si$_5$N$_8$, (Sr,Ca)AlSiN$_3$, (Sr,Ca)AlSi$_4$N$_7$, (Ba,Sr,Ca)Si$_2$O$_2$N$_2$, β-sialon (Si$_{6-x}$Al$_x$N$_{8-x}$O$_x$ where 0<x≤4.2), α-sialon (Ca(Si,Al)$_{12}$(N,O)$_{16}$, or (La,Y)$_3$Si$_6$N$_{11}$ as a matrix.

Thereamong, a nitride phosphor containing a crystal phase of a tetragonal crystal or an orthorhombic crystal is preferred since it prominently exhibits the effects of the first invention.

Further, the nitride phosphor according to the embodiments of the first invention preferably contains a crystal phase that has a chemical composition represented by the following Formula (1). Particularly, the crystal phase is more preferably a tetragonal crystal or an orthorhombic crystal, still more preferably a tetragonal crystal.

$$M1_xM2_yM3_z:M4 \qquad (1)$$

In Formula (1), M1 represents at least one element selected from the group consisting of yttrium (Y), lanthanum (La), gadolinium (Gd) and lutetium (Lu), and preferably contains at least one selected from the group consisting of Y, La and Gd. When the nitride phosphor according to the embodiments of the first invention is used as a phosphor for an LED or as a matrix of a phosphor for an LED, from the standpoints of the excitation wavelength, the emission wavelength, the emission efficiency and the cost, it is preferred that M1 contain La, and it is more preferred that the ratio of La with respect to all elements constituting M1 be not lower than 50% by element.

In Formula (1), M2 represents at least one element selected from the group consisting of germanium (Ge), silicon (Si), hafnium (Hf), zirconium (Zr), aluminum (Al), gallium (Ga) and titanium (Ti). M2 preferably contains Si, more preferably contains Si as an essential element, and the ratio of Si with respect to all elements constituting M2 is still more preferably 50% by element, most preferably 100% by element.

In Formula (1), M3 contains N as an essential element and represents at least one element selected from the group consisting of nitrogen (N), oxygen (O), fluorine (F) and chlorine (Cl). The ratio of N with respect to all elements constituting M3 is more preferably not lower than 50% by element, still more preferably not lower than 80% by element, and M3 most preferably consists of only N.

In Formula (1), M4, which is an activation element (activator), represents at least one element selected from the group consisting of europium (Eu), cerium (Ce), praseodymium (Pr), chromium (Cr), neodymium (Nd), samarium (Sm), terbium (Tb), dysprosium (Dy), holmium (Ho), erbium (Er), thulium (Tm), ytterbium (Yb) and manganese (Mn). M4 suitably represents at least one element selected from the group consisting of Eu, Ce, Pr and Mn. Thereamong, M4 preferably contains Eu or Ce, and the ratio of Ce in all activators is more preferably 80% by mole, still more preferably not lower than 95% by mole. M4 most preferably consists of only Ce.

Usually, from the standpoint of excitation light absorption rate, the activator concentration in the nitride phosphor according to the embodiments of the first invention is preferably 0.001% by mole or higher, more preferably 0.01% by mole or higher, still more preferably 0.1% by mole or higher, with respect to M1. Meanwhile, an excessively high activator concentration increases the effect of concentration quenching. Furthermore, an excessively high activator concentration causes the generation of a heterophase or crystal strain that shows a chemical composition different from the one represented by Formula (1), therefore, usually, the activator concentration is preferably not higher than 50% by mole, more preferably not higher than 30% by mole, still more preferably not higher than 15% by mole. The activator concentration is preferably in the above-described range from the standpoint of attaining good emission characteristics.

A nitride phosphor using Ce as the activator is likely to have an emission chromaticity coordinate x of less than 0.43 when La is used alone as M1. In this case, by using other element having a smaller ionic radius in addition to La as M1, the emission wavelength can be increased. The element to be used in combination with La is preferably Y or Gd since it not only has an ionic radius similar to that of La but also assumes the same charge as La and, therefore, Y or Gd has only a small effect on the emission brightness of the resulting nitride phosphor and can adjust the emission chromaticity coordinate x.

Examples of other method of adjusting the emission color include substitution of M1 with other rare-earth element and/or an alkaline earth metal element such as calcium (Ca) or strontium (Sr); substitution of Si, which is M2, with an element having a charge similar to that of a Group 13 to 14 element such as Al; and substitution of N, which is M3, with O or a halogen element. In any case, a variety of elements can be used within a range that does not largely change the crystal structure.

In Formula (1), x satisfies $2.0 \leq x \leq 4.0$, y satisfies $5.0 \leq y \leq 7.0$, and z satisfies $10.0 \leq z \leq 12.0$.

The subscripts x, y and z in Formula (1) set the molar ratio of the respective elements based on the following standpoints. The element molar ratio (x:y:z) in Formula (1) is 3:6:11 in terms of stoichiometric composition. In practice, however, an excess or deficiency occurs due to depletion caused by oxygen, charge compensation and the like. An acceptable range of such excess or deficiency is usually 10% or greater, and the excess or deficiency may occur in a range of 10% or less; however, the occurrence of the excess or deficiency is known to result in the generation of a heterophase. Therefore, the range of the excess or deficiency is preferably about 10%. The phosphor is usable as long as the excess or deficiency is in this range. An excess or deficiency occurring outside of this range is not preferred since it leads to the generation of a heterophase.

In other words, x in Formula (1) is usually a value satisfying $2.0 \leq x \leq 4.0$, and the lower limit value thereof is preferably 2.5, more preferably 2.7, while the upper limit value thereof is preferably 3.5, more preferably 3.3.

Further, y in Formula (1) is usually a value satisfying $5.0 \leq y \leq 7.0$, and the lower limit value thereof is preferably 5.4, more preferably 5.7, while the upper limit value thereof is preferably 6.6, more preferably 6.3.

Moreover, z in Formula (1) is usually a value satisfying $10 \leq z \leq 12$, and the lower limit value thereof is preferably 10.5, while the upper limit value thereof is preferably 11.5.

The elements in Formula (1) may each be substituted so as to satisfy the law of conservation of charge and, for example, an Si site or an N site may be partially substituted with O or the like. Such a nitride phosphor can also be suitably used in the below-described applications as the nitride phosphor according to the embodiments of the first invention.

With regard to the composition of the nitride phosphor as a whole, the nitride phosphor may contain a certain amount of impurities such as oxygen through partial oxidation, halogenation or the like, as long as the effects of the present invention are obtained. The chemical composition represented by Formula (1) may have any ratio (molar ratio) of oxygen/(oxygen+nitrogen) as long as the nitride phosphor of the present invention that contains a crystal phase having the chemical composition represented by Formula (1) is obtained; however, the ratio (molar ratio) of oxygen/(oxygen+nitrogen) is usually 5% or less, preferably 1% or less, more preferably 0.5% or less, still more preferably 0.3% or less, particularly preferably 0.2% or less.

(Characteristics in FT-IR Analysis)

The nitride phosphor according to the embodiments of the first invention has two or more absorption peaks (maximum points) in a range of 3,200 to 3,300 cm$^{-1}$ in an infrared absorption (FT-IR) spectrum (a characteristic of the nitride phosphor according to the first embodiment of the first invention of the present invention), or has an absorption peak (maximum point) in a range of 3,720 to 3,760 cm$^{-1}$ in the infrared absorption (FT-IR) spectrum (a characteristic of the nitride phosphor according to the second embodiment of the first invention of the present invention).

As for the height of each absorption peak, since each absorption peak often overlaps with a broad peak that is attributed to adsorbed water and exists in a range of 3,000 to 3,700 cm$^{-1}$, the effect thereof needs to be eliminated.

For this purpose, a line connecting a point at the wavenumber of each absorption peak+10 cm$^{-1}$ and a point at the wavenumber of the absorption peak −10 cm$^{-1}$ is taken as a baseline, and the difference between the measured value of the absorption peak and a midpoint of the above-described two points is regarded as the height of the absorption peak as in the following Formula (I).

$$H = I_P - (I_{p+10} + I_{p-10})/2 \qquad (I)$$

(wherein,

H: absorption peak height;

$I_P$: measured value of particular absorption peak;

$I_{p+10}$: measured value at wavenumber of absorption peak $I_P$+10 cm$^{-1}$; and $I_{p-10}$: measured value at wavenumber of absorption peak $I_P$−10 cm$^{-1}$)

It is noted here that these measured values are relative values, taking a maximum intensity in a range of 1,165 to 1,185 cm$^{-1}$ as 1.

Further, in order to distinguish each absorption peak from noise in the measurement, a peak having a height of 5σ or higher, where σ is the standard deviation of values measured in a range of 3,900 to 4,000 cm$^{-1}$, is regarded as an absorption peak. For example, in FIG. 9 of Patent Document 3, innumerable saw-tooth signals, which are considered as noise, are observed in a broad range including a region of 3,200 to 3,300 cm$^{-1}$; however, by setting a threshold value of an absorption peak as described above, an absorption peak can be distinguished from the noise.

In addition, only a peak having a maximum point on an infrared absorption spectrum is regarded as an absorption peak.

Figure 2:
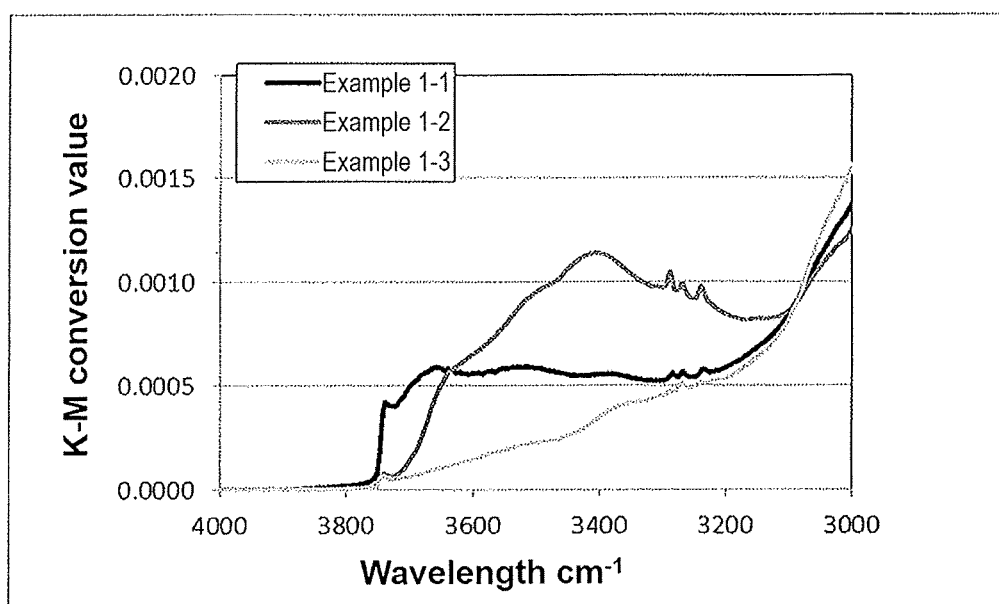
FIG. 2 shows infrared absorption spectra of the phosphors of Examples 1-1 to 1-3.
Figure 3:
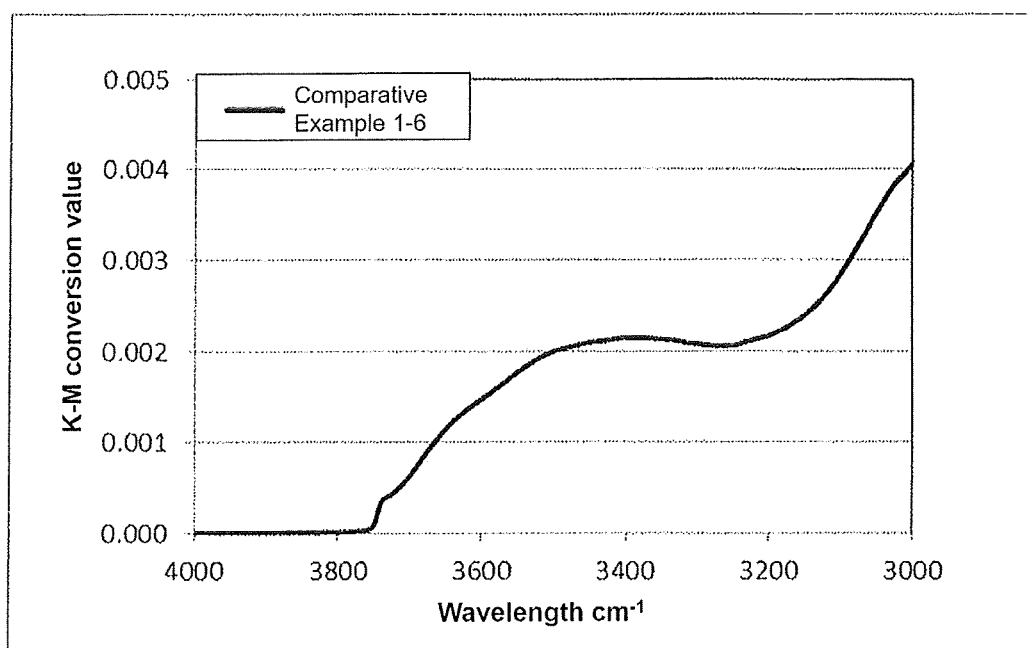
FIG. 3 shows an infrared absorption spectrum of the phosphor of Comparative Example 1-6.

For example, in the infrared absorption (FT-IR) spectrum shown in FIG. 2, it is seen that the nitride phosphor of Example 1 has maximum absorption points (absorption peaks) at 3,738 cm$^{-1}$ in a range of 3,720 to 3,760 cm$^{-1}$ and at 3,236, 3,268 and 3,285 cm$^{-1}$ in a range of 3,200 to 3,300 cm$^{-1}$. On the other hand, in the infrared absorption spectrum of Comparative Example 1-6 shown in FIG. 3, a small mound is observed in a range of 3,720 to 3,760 cm$^{-1}$; however, this mound is not regarded as an absorption peak since it has no maximum point.

The nitride phosphor according to the first embodiment of the first invention of the present invention preferably has a maximum absorption point in two or more ranges of 3,220 to 3,250 cm$^{-1}$, 3,255 to 3,275 cm$^{-1}$ and 3,280 to 3,300 cm$^{-1}$, more preferably has at least one maximum absorption point in each of the ranges of 3,220 to 3,250 cm$^{-1}$, 3,255 to 3,275 cm$^{-1}$ and 3,280 to 3,300 cm$^{-1}$. In addition, when a maximum intensity in a range of 1,165 to 1,185 cm$^{-1}$ is taken as 1, the height of each absorption peak is preferably not less than 5.0×10$^{-6}$, more preferably not less than 1.0×10$^{-5}$. Further, the half-width of each absorption peak is preferably 50 cm$^{-1}$ or less.

In the nitride phosphor according to the second embodiment of the first invention of the present invention, when a maximum intensity in a range of 1,165 to 1,185 cm$^{-1}$ is taken as 1, the height of an absorption peak is preferably not less than 5.0×10$^{-6}$, more preferably not less than 1.0×10$^{-5}$. Further, the half-width of the absorption peak is preferably 50 cm$^{-1}$ or less.

The first invention of the present invention exerts the effects of the present invention regardless of whether it takes the first or the second embodiment; however, the first invention of the present invention has the constitutions of both embodiments.

Conventionally, it is known that an infrared absorption (FT-IR) spectrum has an absorption peak attributed to Si—OH between 3,720 to 3,760 cm$^{-1}$ and plural absorption peaks attributed to —NH between 3,200 to 3,300 cm$^{-1}$. According to the studies conducted by the present inventors, since such absorption peaks observed in FIG. 2 each have a narrow half-width, the environment surrounding each of these bonds is believed to be constant. In other words, it is suggested that the bonds such as Si—OH and —NH exist in the form of substituting a part of a crystal structure.

It is natural to consider that these bonds are generated at crystal defects such as dangling bonds existing in the crystal structure, rather than that the bonds are generated through breakage and substitution of a strong covalent bond such as Si—N constituting the nitride phosphor according to the embodiments of the first invention. In other words, those bonds that yield the absorption peaks characteristically observed in the FT-IR spectrum of the nitride phosphor according to the embodiments of the first invention, such as Si—OH and —NH, are believed to have a function of filling defects in the crystal structure that are spontaneously generated during firing of the nitride phosphor.

Moreover, considering the properties of the nitride phosphor, particularly the reliability, it is also regarded as important to reduce the amount of water itself physically adsorbing to the particles of the nitride phosphor. When a maximum intensity in a range of 1,165 to 1,185 cm$^{-1}$ is taken as 1, a maximum value in a range of 3,100 to 3,800 cm$^{-1}$ where a broad absorption peak attributed to adsorbed water appears is preferably 0.005 or less.

As a method of filling crystal defects with H and OH and a method of reducing the amount of physically adsorbed water as described above, for example, the below-described heating step can be applied, and the heating step is preferably performed after the washing step.

(Particle Size of Nitride Phosphor)

The nitride phosphor according to the embodiments of the first invention has a volume median size of usually 0.1 μm or larger, particularly preferably 0.5 μm or larger, but usually m or smaller, particularly preferably 25 μm or smaller.

(Reliability of Nitride Phosphor)

In the nitride phosphor according to the embodiments of the first invention, the emission efficiency is improved by repairing defects of a crystal lattice itself, rather than by covering the surface with water adsorbing thereto. Therefore, the nitride phosphor according to the embodiments of the first invention is a nitride phosphor that is hardly deteriorated in the long-term use and is thus highly reliable, showing only a small reduction in brightness and a minor change in chromaticity in the long-term use. For example, when a semiconductor light-emitting device produced by arranging a nitride phosphor-dispersed resin immediately above blue LEDs is energized and illuminated for 100 hours in an incubator at 85° C. and 85% RH, the reliability can be evaluated by determining the amount of change in the emission efficiency before and after illumination (emission efficiency retention rate) as well as the amount of change in the value of chromaticity x or chromaticity y before and after illumination (Δx or Δy). The higher the emission efficiency after a lapse of time, the less is the deterioration of the nitride phosphor and the higher is the reliability. Further, since a nitride phosphor emitting a yellow light largely contributes to the value of chromaticity y, the smaller the absolute value of Δy, the less is the deterioration of the nitride phosphor and the higher is the reliability.

Since it is preferred that the nitride phosphor according to the embodiments of the first invention have a high emission efficiency when used as an LED phosphor in a semiconductor light-emitting device, the nitride phosphor according to the embodiments of the first invention preferably has a high brightness. In addition, the nitride phosphor according to the embodiments of the first invention is preferably highly reliable as well since LEDs are used over a longer period than conventional incandescent light bulbs, cold-cathode tubes and the like.

<2. Method of Producing Nitride Phosphor 1>

A method of producing the nitride phosphor according to the embodiments of the first invention (hereinafter, may be referred to as "the production method according to the first invention") is a method of producing a nitride phosphor represented by the above-described Formula (1) and includes: the raw material mixing step of weighing raw materials containing constituent elements of the nitride phosphor and mixing the raw materials; the firing step of firing the thus obtained raw material mixture in an atmosphere containing not less than 90% by volume of nitrogen; the washing step of washing a fired product obtained in the firing step with an acid or an alkali; and the heating step of heating the fired product washed in the previous washing step in an atmosphere having an oxygen content of not higher than 10,000 ppm.

In the embodiments of the first invention, the term "fired product" refers to a product obtained after the firing step. The term "fired product" encompasses not only a fired product obtained immediately after the firing step, but also a fired product that has been subjected to "2-3. Washing Step" performed prior to the below-described "2-4. Heating Step", and "2-5. Other Treatment Steps".

These steps will now be sequentially described.

(2-1. Raw Material Mixing Step)

(Raw Materials)

Examples of raw materials used in the present invention include metals, alloys and compounds, which contain constituent elements M1 and M2 of the matrix of the nitride phosphor, other elements added for adjustment of the emission wavelength and the like, and M4 that is an activator.

Examples of a compound used as a raw material include nitrides, oxides, hydroxides, carbonates, nitrates, sulfates, oxalates, carboxylates, and halides (e.g., fluorides) of the elements constituting the nitride phosphor. A specific type of the compound may be selected as appropriate from these metal compounds, taking into consideration, for example, the reactivity to an intend product and the low amounts of NO$_x$, SO$_x$, and the like generated during firing; however, from the standpoint that the phosphor according to the embodiments of the first invention is a nitride phosphor, it is preferred to use a nitride and/or an oxynitride. Particularly, a nitride is preferably used since it also serves as a nitrogen source.

Specific examples of the nitride and the oxynitride include nitrides of nitride phosphor-constituting elements such as LaN, $Si_3N_4$ and CeN, and composite nitrides of nitride phosphor-constituting elements such as $La_3Si_6N_{11}$ and $LaSi_3N_5$.

The above-described nitride may contain a trace amount of oxygen. The nitride may have any ratio (molar ratio) of oxygen/(oxygen+nitrogen) as long as the nitride phosphor according to the embodiments of the first invention can be obtained; however, excluding the oxygen derived from adsorbed water, the ratio (molar ratio) of oxygen/(oxygen+nitrogen) is usually 5% or less, preferably 1% or less, more preferably 0.5% or less. An excessively high ratio of oxygen in the nitride may cause a reduction in the brightness. However, taking into consideration the reactivity of raw materials, it is also possible to partially use an oxide raw material that normally has a lower reaction temperature than nitrides.

Further, it is preferred to use the matrix of the nitride phosphor or the nitride phosphor itself as a part of a raw material. Since the matrix of the nitride phosphor or the nitride phosphor has already completed the reaction to become the matrix of the resulting nitride phosphor and thus only contributes to growth, it is unlikely to generate reaction heat or the like and, when nitridation of other raw material starts to run out of control, it inhibits reaction runaway and functions to dissipate heat; therefore, it is preferred to add the matrix of the nitride phosphor or the nitride phosphor itself in an amount of about 1 to 10% by mass of all raw materials.

When an oxygen-containing compound such as an oxide is used as a raw material, particularly when the oxygen-containing compound is used in a large amount, in order to prevent oxygen from being incorporated into the resulting nitride phosphor more than necessary, it is preferred to devise a measure for removal of oxygen by, for example, performing superheating in an ammonia-containing or hydrogen-containing atmosphere in an early stage of firing. As the above-described raw materials, the various materials described in Patent Documents 1 and 2 (WO 2008/132954 and WO 2010/114061) can be used. Particularly, a method using an alloy is described in detail in Patent Document 2. Needless to say, an alloy may be used along with a flux added as a growth aid.

(Growth Aid: Addition of Flux)

Fluxes are also described in detail in Patent Documents 1 and 2, and the fluxes described in these Patent Documents can be used.

That is, examples of such fluxes include, but not limited to: ammonium halides such as $NH_4Cl$ and $NH_4F \cdot HF$; alkali metal carbonates such as $Na_2CO_3$ and $Li_2CO_3$; alkali metal halides such as LiCl, NaCl, KCl, CsCl, LiF, NaF, KF, and CsF; alkaline earth metal halides such as $CaCl_2$, $BaCl_2$, $SrCl_2$, $CaF_2$, $BaF_2$, $SrF_2$, $MgCl_2$, and $MgF_2$; alkaline earth metal oxides such as BaO; boron oxide, boric acid, and boronate compounds of alkali metals and alkaline earth metals such as $B_2O_3$, $H_3BO_3$, and $Na_2B_4O_7$; phosphate compounds such as $Li_3PO_4$ and $NH_4H_2PO_4$; aluminum halides such as $AlF_3$; compounds of Group 15 elements of the periodic table such as $Bi_2O_3$; and nitrides of alkali metals, alkaline earth metals and Group 13 elements such as $Li_3N$, $Ca_3N_2$, $Sr_3N_2$, $Ba_3N_2$, and BN.

Other examples of the fluxes include halides of rare-earth elements such as $LaF_3$, $LaCl_3$, $GdF_3$, $GdCl_3$, $LuF_3$, $LuCl_3$, $YF_3$, $YCl_3$, $ScF_3$, and $ScCl_3$; and oxides of rare-earth elements such as $La_2O_3$, $Gd_2O_3$, $Lu_2O_3$, $Y_2O_3$, and $Sc_2O_3$.

As the above-described flux, halides are preferred and, specifically, for example, alkali metal halides, alkaline earth metal halides, and halides of rare-earth elements are preferred. Among these halides, fluorides and chlorides are preferred.

Among the above-exemplified fluxes, those that are deliquescent are preferably used as anhydrides. Further, as a flux to be used in combination, two or more of the above-exemplified fluxes may be used in any combination and at any ratio. Particularly preferred examples of the flux to be used in combination include $MgF_2$, $CeF_3$, $LaF_3$, $YF_3$, and $GdF_3$. Thereamong, $LaF_3$ is more preferred since La is a matrix-constituting element. Meanwhile, for example, $YF_3$ and $GdF_3$ have an effect of modifying the chromaticity coordinates x and y (x, y) of the emission color.

Moreover, as fluxes that are not specifically described in Patent Documents 1 and 2, fluxes containing a halide or the like of rubidium or cesium are preferred since they release large cations that are unlikely to be incorporated into the resulting nitride phosphor. In addition, halides and oxides of a matrix element or an activator are also preferred since they can double as both a raw material and a flux. The amount of these fluxes to be used is preferably 0.1% by mass to 20% by mass with respect to the added nitride phosphor. Selections of raw materials and fluxes are important since they largely affect the quality of the nitride phosphor obtained after the firing step.

(Mixing of Raw Materials)

When an alloy for nitride phosphor production is used, as long as the composition ratio (molar ratio) of the metal elements in the resulting mixture matches the composition ratio of the metal elements contained in the crystal phase having the chemical composition represented by Formula (1), the alloy for nitride phosphor production and, as required, a flux(es) may be mixed in addition to the above-described raw materials.

On the other hand, when an alloy for nitride phosphor production is not used or the composition ratio of the metal elements in the resulting mixture does not match the composition ratio of the metal elements contained in the crystal phase having the chemical composition represented by Formula (1), an alloy for nitride phosphor production is mixed with an alloy for nitride phosphor production that has a different composition, a simple metal, a metal compound or the like, whereby the mixing amount is adjusted such that the composition ratio of the metal elements contained in the raw materials matches the composition ratio of the metal elements contained in the crystal phase having the chemical composition represented by Formula (1) before performing firing.

The composition of the raw materials may be modified within a range of about 0.5 to 2 times of a theoretical composition. In the case of the nitride phosphor according to the embodiments of the first invention, the theoretical composition ratio of M1 and M2 in Formula (1) is 1:2. A compound having a composition ratio of 1:3 exists as a compound having a similar composition ratio (molar ratio); therefore, in order to inhibit the generation of such a compound, it is preferred to increase the molar ratio of M1. Such a modification of the composition ratio is particularly preferred when the ratio of oxygen and halogen is high in the raw materials.

Mixing of the nitride phosphor raw materials may itself be performed by any known method. For example, a method of adding the raw materials to a pot along with a solvent and subsequently mixing the raw materials while crushing them with balls, a method of dry-mixing the raw materials and subsequently sieving the resulting mixture, or a method of mixing the raw materials using a mixing machine such as a powder mixer may be particularly preferably employed. When the raw materials are dispersed and mixed in a solvent, the solvent is removed as a matter of course and, as required, the resulting dry aggregates are pulverized. These operations are performed preferably in a nitrogen atmosphere.

Further, when the nitride phosphor of the present invention is produced by performing firing multiple times, it is preferred to add and thoroughly mix the flux by, for example, passing them through a sieve, prior to a step performed at the highest firing temperature.

(2-2. Firing Step)

The thus obtained raw material mixture is usually charged to a container such as a crucible or a tray, which is subsequently set in a heating furnace whose atmosphere can be controlled. Examples of the material of the container used in this process include boron nitride, silicon nitride, carbon, aluminum nitride, molybdenum, and tungsten. Thereamong, molybdenum and boron nitride are preferred from the standpoint of obtaining a nitride phosphor having excellent corrosion resistance. Any of the above-exemplified materials may be used individually, or two or more thereof may be used in any combination and at any ratio. When the raw material mixture is fired multiple times, the crucible used for firing performed at a relatively low temperature has a high degree of freedom and may be made of, for example, a ceramic material such as boron nitride, alumina or zirconia; a metal material such as molybdenum or tungsten; or a composite material obtained by coating the inside of a boron nitride crucible with a paste of molybdenum or the like.

A fired product used in the first invention of the present invention can be obtained by firing the raw material mixture.

The firing temperature is most preferably a temperature at which generation of the matrix of the nitride phosphor is initiated and a nucleus for the subsequent crystal growth is generated. Although the firing temperature slightly varies depending on the raw materials and the pressure, the lower limit value thereof is preferably 1,100° C. or higher, more preferably 1,250° C. or higher, most preferably 1,350° C. or higher. As for the lower limit value of the firing temperature, even a lower temperature may be compensated by an increase in the firing time, as long as the growth of a nucleus takes place and the nucleus does not grow more than necessary. Meanwhile, from the standpoint of appropriately controlling the firing time, the upper limit value of the firing temperature is preferably 2,000° C. or lower, more preferably 1,800° C. or lower, most preferably 1,700° C. or lower. When firing is performed in an environment where the furnace gas pressure is higher than the atmospheric pressure, the suitable firing temperature shifts to the higher temperature side.

The term "firing temperature" used herein refers to the highest temperature reached in the firing step.

From the standpoints of the productivity and the control of crystal growth, the firing time is preferably 2 hours to 40 hours. The term "firing time" used herein refers to a duration for which the raw material mixture is retained at the above-described highest temperature.

The atmosphere in which firing is performed is preferably a nitrogen atmosphere or an ammonia atmosphere, more preferably an atmosphere in which nitrogen is mixed with 10% or less of hydrogen. A large amount of hydrogen poses a risk of explosion. Therefore, the amount of hydrogen is most preferably 4% or less.

In the case of performing firing multiple times (a first firing operation may be hereinafter referred to as "primary firing"), it is preferred to add a flux and the like as required to the resulting primary fired product and to subsequently, for example, re-disperse the resultant by grinding the resultant using a mortar or sieving the resultant, thereby inhibiting aggregation caused by heating, and improving the uniformity of the raw materials. These operations are preferably performed in a nitrogen atmosphere or an inert atmosphere. In this case, the oxygen concentration in the atmosphere is controlled at preferably 1% by volume or less, particularly preferably 100 ppm or less. A second and subsequent firing operations may be performed under firing conditions of the same ranges as those of the above-described primary firing; however, in order to allow crystals to grow efficiently, it is preferred to adopt the conditions described in WO 2010/114061 (Patent Document 2).

In this step, any firing apparatus can be used as long as the effects of the present invention are obtained; however, an apparatus in which the atmosphere can be controlled is preferred, and an apparatus in which the atmosphere and the pressure can both be controlled is more preferred. For example, a hot isotropic pressing device (HIP) or a vacuum-pressure atmosphere heating furnace is preferably used.

Further, prior to the initiation of heating, it is preferred to circulate a nitrogen-containing gas into the firing apparatus and thereby thoroughly replace the atmosphere in the system with the nitrogen-containing gas. If necessary, the system may be evacuated before circulating the nitrogen-containing gas.

(2-3. Washing Step)

The washing step is the step of washing the surface of the thus obtained fired product or nitride phosphor with, for example, water such as deionized water, an organic solvent such as ethanol, or an aqueous alkaline solution such as aqueous ammonia.

For the purpose of, for example, improving the emission characteristics by removing an impurity phase adhering to the surface of the fired product or nitride phosphor through removal of the flux being used or the like, it is also possible to use, for example, an acidic aqueous solution containing an inorganic acid such as hydrochloric acid, nitric acid, sulfuric acid, aqua regia, or a mixture of hydrofluoric acid and sulfuric acid; or an organic acid such as acetic acid.

These techniques are described in detail in Patent Documents 1 and 2, and may be performed in accordance therewith.

(2-4. Heating Step)

The fired product subjected to the washing step is heated in an atmosphere having an oxygen content of 10,000 ppm or less or in an atmosphere having a water content of 10.0% by volume or less, whereby a highly reliable nitride phosphor having a high brightness can be obtained.

The heating step can be performed by charging the fired product to a container such as a crucible or a tray, and subsequently setting and heating the container in a heating furnace whose atmosphere can be controlled.

As the material of the container used in this process, for example, a ceramic material such as quartz, boron nitride, alumina, zirconia, or silicon carbide; a metal material such as molybdenum or tungsten; or a composite material obtained by coating the inside of a boron nitride crucible with a paste of molybdenum or the like, can be used. Any of these materials may be used individually, or two or more thereof may be used in any combination.

As the heating furnace, any heating furnace can be used as long as the effects of the present invention are obtained; however, such an apparatus in which the atmosphere can be controlled as the one used in the above-described firing step is preferred, and an apparatus in which the atmosphere and the pressure can both be controlled is more preferred. For example, a hot isotropic pressing device (HIP) or a vacuum-pressure atmosphere heating furnace is preferably used.

The heating temperature in the heating step is preferably 500° C. or higher, more preferably 650° C. or higher, still more preferably 750° C. or higher, but preferably 1,300° C. or lower, more preferably 1,100° C. or lower. In this heating step, heating is performed at a relatively higher temperature than a conventional vapor heat treatment; therefore, reactions are allowed to efficiently proceed for the purposes of, for example, complementing crystal defects and reducing the physically adsorbed water, which is preferred.

In addition, the relationship between the heating temperature in this step and the highest temperature in firing is important, and the heating temperature is 1,000 to 400° C. lower than the highest temperature in the firing step, i.e. heating is performed at a temperature sufficiently lower than the synthesis temperature. Such a heating temperature is preferred since, when the heating temperature is higher than a temperature of 1,000° C. lower than the highest temperature in firing (highest temperature—1,000° C.), the intended reactions are likely to occur and an increase in the brightness of the nitride phosphor is thus likely to be achieved, while when the heating temperature is lower than a temperature of 400° C. lower than the highest temperature in firing (highest temperature—400° C.), a reduction in the brightness of the nitride phosphor caused by degradation of the structure itself of the nitride phosphor or lattice rearrangement can be suppressed.

In order to heat the whole fired product to a uniform temperature, the heating time in the heating step is preferably 2 hours or longer, more preferably 4 hours or longer, still more preferably 6 hours or longer; however, from the productivity standpoint, the heating time is preferably not longer than 80 hours, more preferably not longer than 50 hours.

From the productivity standpoint, the higher the rate of heating and cooling, the more preferred it is. On the other hand, by restricting the rate to be moderate, generation of a strain and cracking in the crystals are suppressed, so that the resulting nitride phosphor is allowed to maintain a good quality. Therefore, the rate of heating and cooling is preferably 100° C./min or slower, more preferably 5° C./min or slower, still more preferably 1° C./min or slower.

In the atmosphere inside the heating furnace, the oxygen content is sufficiently 10,000 ppm or less, preferably 1,000 ppm or less, and a reduction in the oxygen content does not drastically improve the properties. Therefore, the oxygen content may be 10 ppm or higher, preferably 100 ppm or higher.

Examples of a method of adjusting the atmosphere inside the heating furnace to have an oxygen content of 10,000 ppm or less include a method of supplying a noble gas such as argon (Ar) or helium (He), or a nitrogen gas ($N_2$) into the heating furnace; a method of reducing the pressure inside the heating furnace to vacuum; and a method of using an oxygen-absorbing getter. A method of using an appropriate amount of hydrogen or ammonia may be employed as well; however, it is not necessary to use such a gas that poses a risk of explosion, and any of the above-exemplified methods that can be easily employed for the production is adequate. In addition, any of the above-exemplified methods of reducing the oxygen content may be used in combination with a method of increasing the oxygen content. Examples of the method of increasing the oxygen content include a method of supplying an appropriate amount of oxygen gas or the air; and a method of allowing an oxidizing compound such as a peroxide or an oxide, or an oxidizing solid to coexist in the heating furnace, or blending such an oxidizing compound or solid into the fired product.

The oxygen content in the heating furnace can be measured using a galvanic- or zirconia-type oxygen concentration meter. The measurement may be directly performed in the heating furnace; however, since the sensor is heavily worn out due to the high temperature in the heating furnace, a method of measuring a feed gas or a discharged gas may be employed as well.

In the heating step, the water content of the atmosphere inside the heating furnace may be 0% by volume; however, it is preferably 0% by volume or higher, more preferably 1.0% by volume or higher, but preferably 10.0% by volume or less, more preferably 4.0% by volume or less, still more preferably 3.0% by volume or less. It is preferred to control the water content of the atmosphere to be in the above-described range, since the brightness of the resulting nitride phosphor thereby tends to be improved.

Water can be supplied into the heating furnace by, for example, a method of passing the gas to be supplied into the furnace through a bubbler filled with water in advance and thereby introducing a water-containing gas; a method of using an appropriate amount of water vapor gas; or a method of allowing a compound capable of supplying water through degradation of a hydrate or a hydroxide to coexist in the heating furnace, or blending such a compound into the fired product. The water content of the atmosphere inside the heating furnace can be adjusted by, for example, adjusting the temperature of the bubbler through which the gas is passed through; adjusting the ratio of the gas passed through the bubbler and a gas not passed through the bubbler; or adjusting the amount of a coexisting material that releases water. In addition, the oxygen content and the water content of the atmosphere inside the heating furnace may be modified as appropriate during the heating step. When a method of using a coexisting material is employed, since the coexisting material is thermally degraded to release oxygen and/or water in some cases, the oxygen content and the water content of the atmosphere inside the heating furnace may be modified by adjusting the furnace temperature. Moreover, the oxygen content and the water content of the atmosphere inside the heating furnace may be modified by intentionally adjusting the oxygen content and the water content in the feed gas.

The above-described heating step does not have to be performed under a single condition and, for example, the heating step may be performed plural times in different atmospheres. Further, the heating step may be performed in combination with, as a pretreatment or a past-treatment, an existing heat treatment performed under a condition different from that of the heating step. Specifically, for example, as a pretreatment, a heat treatment can be performed in an atmosphere having an oxygen content and a water content that are not lower than the respective ranges of the heating step, and the heating step can be performed thereafter to obtain a favorable nitride phosphor. The terms "pretreatment" and "the heating step" used herein refer to the steps that may be performed separately from each other or may be performed as a series of steps while modifying the oxygen content and/or the water content in the atmosphere in the middle of heating.

The water content inside the heating furnace can be measured using a dew point meter. As in the case of measuring the oxygen content, the water content may be measured directly in the heating furnace; however, since the sensor is heavily worn out due to the high temperature in the heating furnace, a method of measuring a feed gas or a discharged gas may be employed as well.

As conventionally known in Patent Document 3 or 4, in the nitride phosphor of Formula (1), it was believed preferable to perform a vapor heat treatment at a relatively low temperature in an atmosphere containing a large amount of water in a saturated or substantially saturated state and thereby form a coating film derived from water vapor on the surface of the nitride phosphor. The present inventors discovered that, while such a coating film enables to increase the brightness of the nitride phosphor, since the majority of the coating film is constituted by physically adsorbed water, there is a problem that the coating film gradually disappears in the long-term use under the actual use environment and the brightness of the nitride phosphor is consequently reduced with time.

According to the studies conducted by the present inventors, by performing a heat treatment under the conditions of the above-described heating step, defects in the crystal structure were repaired through formation of specific bonds while the coating film that was derived from adsorbed water and enabled to increase the brightness in Patent Document 3 or 4 was conversely eliminated, whereby a highly reliable nitride phosphor having a high brightness without being degraded even in the long-term use was successfully obtained.

This technique increases the brightness based on the above-described mechanism; therefore, it is applicable to not only the nitride phosphor of Formula (1) (LSN phosphor) but also nitride phosphors having a silicon nitride structure.

(2-5. Other Treatment Steps)

In the production method according to the first invention, in addition to the above-described steps, other treatment step(s) may be performed as required. For example, the pulverization step, the classification step, the surface treatment step, and/or the drying step may be performed as required after the above-described firing step. In addition to these basic steps of a nitride phosphor production method, for example, the below-described vapor heat treatment may be performed as well.

The pulverization step, the washing step, the classification step, the drying step, the vapor heat treatment and/or the surface treatment step may be performed before, during or after the above-described heating step; however, from the standpoint of maximizing the effects of the heating step, they are preferably performed before the heating step. Further, when a pretreatment or a post-treatment is performed before or after the heating step, the above-described other treatment steps may be performed before or after the pretreatment or the post-treatment.

(Pulverization Step)

The pulverization step may be performed using, for example, a pulverizer such as a hammer mill, a roll mill, a ball mill, a jet mill, a ribbon blender, a V-type blender or a Henschel mixer, or a combination of a mortar and a pestle. In this process, in order to inhibit destruction of generated nitride phosphor crystals and to facilitate a treatment aimed at disintegration of secondary particles and the like, it is preferred to perform, for example, a ball mill treatment for about 10 minutes to 24 hours in a container made of alumina, silicon nitride, $ZrO_2$ or glass, where balls made of the same material as the container or an iron-cored urethane balls are placed. In this case, a dispersant such as an organic acid or an alkali phosphate (e.g., hexametaphosphoric acid) may be used in an amount of 0.05% by mass to 2% by mass.

(Washing Step)

A concrete mode of the washing step is as described above in "2-3. Washing Step".

(Classification Step)

The classification step can be performed by, for example, dry or wet sieving, or using a classifier such as an air-flow classifier or a vibration sieve. Particularly, by performing dry classification using a nylon mesh, a nitride phosphor with excellent dispersibility having a volume-average size of about 10 μm can be obtained. When dry classification using a nylon mesh and elutriation are performed in combination, a nitride phosphor with good dispersibility having a volume median size of about 20 μm can be obtained.

In the wet sieving or the elutriation, nitride phosphor particles are dispersed in an aqueous medium at a concentration of preferably about 0.1% by mass to 10% by mass. Further, in order to suppress deterioration of the nitride phosphor, the aqueous medium is adjusted to have a pH of usually 4 or higher, preferably 5 or higher, but usually 9 or lower, preferably 8 or lower.

For obtaining nitride phosphor particles having the above-described volume median size, in the wet sieving or the elutriation, from the standpoint of the balance between the operational efficiency and the yield, it is preferred to perform a sieving treatment in two steps of, for example, obtaining particles of 50 μm or smaller and then obtaining particles of 30 μm or smaller. Further, as a lower limit, it is preferred to perform a sieving treatment for particles of usually 1 μm or larger, preferably 5 μm or larger.

(Drying Step)

After the completion of washing in the above-described manner, the nitride phosphor is dried at about 100° C. to 200° C. As required, a dispersion treatment (e.g., dry sieving) may also be performed to such an extent that inhibits dry aggregation.

(Vapor Heat Treatment Step)

The nitride phosphor according to the embodiments of the first invention may be treated with vapor heat. By subsequently performing the above-described heating step, the brightness of the nitride phosphor can be further improved.

When the vapor heat treatment step is incorporated, the lower limit value of the heating temperature is usually 50° C. or higher, preferably 80° C. or higher, more preferably 100° C. or higher. Meanwhile, the upper limit value of the heating temperature is usually 300° C. or lower, preferably 200° C. or lower, more preferably 170° C. or lower. An excessively low heating temperature tends to make it difficult to obtain the effects attributed to the presence of adsorbed water on the surface of the nitride phosphor, while an excessively high heating temperature may disturb the surface of the nitride phosphor particles.

The humidity (relative humidity) in the vapor heat treatment step is usually 50% or higher, preferably 80% or higher, particularly preferably 100%. An excessively low humidity tends to make it difficult to obtain the effects attributed to the presence of adsorbed water on the surface of the nitride phosphor. It is noted here that, as long as the effects attributed to the formation of an adsorbed water layer can be obtained, a liquid phase may coexist with a vapor phase having a humidity of 100%.

The pressure in the vapor heat treatment step is usually normal pressure or higher, preferably 0.12 MPa or higher, more preferably 0.3 MPa or higher, but usually not higher than 10 MPa, preferably not higher than 1 MPa, more preferably not higher than 0.6 MPa. An excessively low pressure tends to make it difficult to obtain the effects of the vapor heat treatment step, while an excessively high pressure requires a large-scale treatment device and may present a problem in operational safety.

The duration for which the nitride phosphor is retained in the presence of vapor varies depending on the above-described temperature, humidity and pressure; however, usually, the higher the temperature, humidity and/or pressure, the shorter may be the retention time. A specific range of the retention time is usually 0.5 hours or longer, preferably 1 hour or longer, more preferably 1.5 hours or longer, but usually not longer than 200 hours, preferably not longer than 100 hours, more preferably not longer than 70 hours, sill more preferably not longer than 50 hours.

One example of a specific method for performing the vapor heat treatment step while satisfying the above-described conditions is a method of placing the nitride phosphor under a high humidity and a high pressure in an autoclave. In addition to or in place of the autoclave, an apparatus such as a pressure cooker that is capable of creating a high-temperature and high-humidity condition at the same level as the autoclave may be used.

As the pressure cooker, for example, TPC-412M (manufactured by ESPEC Corp.) can be used and, by using this pressure cooker, the temperature, the humidity and the pressure can be controlled at 105° C. to 162.2° C., 75 to 100% (depending on the temperature condition) and 0.020 MPa to 0.392 MPa (0.2 kg/cm$^2$ to 4.0 kg/cm$^2$), respectively.

By performing the vapor heat treatment step with the nitride phosphor being retained in an autoclave, a special layer of water can be formed in a high-temperature, high-pressure and high-humidity environment and, therefore, adsorbed water is allowed to exist on the surface of the nitride phosphor in a particularly short time. As for specific conditions, for example, the nitride phosphor may be placed under an environment having a pressure of not lower than normal pressure (0.1 MPa) in the presence of vapor for at least 0.5 hours.

(Surface Treatment Step)

In the production of a light-emitting device using the nitride phosphor according to the embodiments of the first invention, in order to further improve the weather resistance such as moisture resistance or to improve the dispersibility of nitride phosphor-containing parts of the below-described light-emitting device in a resin, a surface treatment of, for example, partially coating the surface of the nitride phosphor with a different substance may be performed as required.

The surface treatment may be performed before or after the heat treatment step, and there is no problem in performing both of these treatments at the same time.

<3. Applications of Nitride Phosphor 1>

The nitride phosphor according to the embodiments of the first invention and a nitride phosphor obtained by the production method according to the first invention can be used in the following applications.

(Nitride Phosphor-Containing Composition)

A nitride phosphor-containing composition using the nitride phosphor according to the embodiments of the first invention contains the nitride phosphor according to the embodiments of the first invention and a liquid medium. When the nitride phosphor according to the embodiments of the first invention is used in an application such as a light-emitting device, the nitride phosphor is preferably used in the form of being dispersed in a liquid medium, namely in the form of a nitride phosphor-containing composition.

As the liquid medium contained in the nitride phosphor-containing composition using the nitride phosphor according to the embodiments of the first invention, any liquid medium can be selected in accordance with the intended purpose and the like, as long as it exhibits liquid properties under the desired use conditions and can suitably disperse the nitride phosphor according to the embodiments of the first invention without inducing an undesirable reaction or the like.

Examples of the liquid medium include silicone resins, epoxy resins, polyvinyl-based resins, polyethylene-based resins, polypropylene-based resins, and polyester-based resins. These liquid media may be used individually, or two or more thereof may be used in any combination and at any ratio. The liquid medium may contain an organic solvent as well.

A concrete mode of the liquid medium such as the amount to be used, may be adjusted as appropriate in accordance with the intended use, and the matters described in "[3. Phosphor-Containing Composition]" of WO 2010/114061 can be applied.

Moreover, since the goal is to disperse the nitride phosphor according to the embodiments of the first invention in a light-transmitting substance, the nitride phosphor according to the embodiments of the first invention may also be dispersed in a material other than a liquid medium such as glass, other transparent ceramic, or an inorganic compound.

(Light-Emitting Device)

A light-emitting device using the nitride phosphor according to the embodiments of the first invention will now be described. The light-emitting device using the nitride phosphor according to the embodiments of the first invention is a light-emitting device including: a first illuminant; and a second illuminant that emits a visible light when irradiated with a light emitted from the first illuminant. The second illuminant contains one or more kinds of the nitride phosphor according to the embodiments of the first invention.

With regard to specific examples of the first illuminant and the second illuminant used in addition to the nitride phosphor according to the embodiments of the first invention as well as modes of the light-emitting device, the matters described in "[4. Light-Emitting Device]" of WO 2010/114061 can be applied.

(Application of Light-Emitting Device)

The application of the light-emitting device using the nitride phosphor according to the embodiments of the first invention is not particularly restricted, and the light-emitting device can be used in a variety of fields where an ordinary light-emitting device is usually used. The nitride phosphor according to the embodiments of the first invention has a wide color reproduction range and exhibits high color rendering properties; therefore, it is particularly preferably used as a light source of a lighting apparatus or an image display device.

(Lighting Apparatus)

A lighting apparatus using the nitride phosphor according to the embodiments of the first invention includes the above-described light-emitting device. For the application of the light-emitting device using the nitride phosphor according to the embodiments of the first invention to a lighting apparatus, the light-emitting device may be integrated into any known lighting apparatus as appropriate.

(Image Display Device)

An image display device using the nitride phosphor according to the embodiments of the first invention includes a light-emitting device using the nitride phosphor according to the embodiments of the first invention. For the use of a light-emitting device using the nitride phosphor according to the embodiments of the first invention as a light source of an image display device, a specific configuration of the image display device is not restricted; however, the light-emitting device is preferably used along with a color filter. For example, when the image display device is a color-image display device utilizing color liquid-crystal display elements, the image display device can be formed by using the above-described light-emitting device as a backlight along with a combination of an optical shutter utilizing a liquid crystal and a color filter having red, green and blue pixels.

<4. Nitride Phosphor 2>

The nitride phosphor according to one embodiment of the second invention of the present invention is a nitride phosphor containing a crystal phase that has a chemical composition represented by the below-described Formula (2), wherein, when the value of a difference between a minimum ionic strength and a maximum ionic strength in a range of 200 to 400° C. in a detection chart for a molecular weight (m/z) of 44 measured by TPD-MS analysis is defined as 1, the value of a difference between a minimum ionic strength and a maximum ionic strength in a range of 500 to 650° C. is 0.5 or larger.

(Type of Nitride Phosphor 2)

The nitride phosphor according to one embodiment of the second invention of the present invention is a nitride phosphor represented by the following Formula (2):

$$M_pSi_qN_r:Z \quad (2)$$

(wherein,

M represents a rare-earth element, excluding an element used as an activator;

Z represents the activator;

p satisfies $2.7 \le p \le 3.3$;

q satisfies $5.4 \le q \le 6.6$; and r satisfies $10 \le r \le 12$).

In Formula (2), Z represents an activator. Examples of the activator include europium (Eu), cerium (Ce), chromium (Cr), manganese (Mn), iron (Fe), praseodymium (Pr), neodymium (Nd), samarium (Sm), terbium (Tb), dysprosium (Dy), holmium (Ho), erbium (Er), thulium (Tm), and ytterbium (Yb). Thereamong, Z preferably contains Eu or Ce, more preferably contains Ce in an amount of not less than 80% by mole in all activators, still more preferably contains Ce in an amount of not less than 95% by mole in all activators, most preferably consists of only Ce.

Particularly, in the nitride phosphor according to one embodiment of the second invention of the present invention, the crystal phase that has the chemical composition represented by Formula (2) is preferably a tetragonal crystal or an orthorhombic crystal, more preferably a tetragonal crystal.

Usually, the activator concentration in the nitride phosphor according to one embodiment of the second invention of the present invention is preferably 0.001% by mole or higher, more preferably 0.01% by mole or higher, still more preferably 0.1% by mole or higher, with respect to M. Meanwhile, an excessively high activator concentration increases the effect of concentration quenching. Furthermore, an excessively high activator concentration causes the generation of a heterophase or crystal strain that shows a chemical composition different from the one represented by Formula (2), therefore, usually, the activator concentration is preferably not higher than 50% by mole, more preferably not higher than 30% by mole, still more preferably not higher than 15% by mole. The activator concentration is preferably in the above-described range from the standpoint of attaining good emission characteristics.

In Formula (2), M is a rare-earth element excluding an element used as the above-described activator, and examples of the rare-earth element include lanthanum (La), yttrium (Y), gadolinium (Gd), and lutetium (Lu). M is preferably at least one element selected from the group consisting of Y, La, Gd and Lu. Thereamong, M preferably contains La, more preferably contains La in an amount of not less than 70% by mole in the whole M, still more preferably contains La in an amount of not less than 85% by mole, most preferably consists of only La.

The nitride phosphor using Ce as the activator is likely to have a chromaticity x of less than 0.43 when La is used alone as M. On the other hand, the nitride phosphor containing Y or Gd in addition to La as M has a chromaticity x of 0.43 or higher. In other words, Y or Gd is preferred since it not only has an ionic radius similar to that of La but also assumes the same charge as La and, therefore, Y or Gd has only a small effect on the emission brightness of the resulting phosphor and can adjust the chromaticity x.

In addition to the use of La, Y, Gd and Lu, for example, M may be substituted with an alkaline earth metal element such as calcium (Ca) or strontium (Sr), Si may be substituted with an element having a charge similar to that of a Group 13 to 14 element such as Al, and/or N may be substituted with O or a halogen element. In any case, a variety of elements can be used within a range that does not largely change the crystal structure.

The subscripts p, q and r in Formula (2) set the molar ratio of the respective elements based on the following standpoints. The element molar ratio (p:q:r) in Formula (2) is 3:6:11 in terms of stoichiometric composition. In practice, however, an excess or deficiency occurs due to depletion caused by oxygen, charge compensation and the like. An acceptable range of such excess or deficiency is usually 10% or greater, and the excess or deficiency is preferably 10% or less since this makes the generation of a heterophase unlikely to occur. The phosphor is usable as long as the excess or deficiency is in this range.

That is, p in Formula (2) is usually a value satisfying $2.5 \le p \le 3.5$, and the lower limit value thereof is preferably 2.7, more preferably 2.9, while the upper limit value thereof is preferably 3.3, more preferably 3.1. Further, q in Formula (2) is usually a value satisfying $5.4 \le q \le 6.6$, and the lower limit value thereof is preferably 5.7, while the upper limit value thereof is preferably 6.3. Moreover, r in Formula (2) is usually a value satisfying $10 \le r \le 12$, and the lower limit value thereof is preferably 10.5, while the upper limit value thereof is preferably 11.5.

The nitride phosphor according to one embodiment of the second invention of the present invention may be substituted simultaneously with other elements so as to satisfy the law of conservation of charge and, as a result, an Si site or an N site may be partially substituted with oxygen or the like. Such a phosphor can also be suitably used.

With regard to the composition of the phosphor as a whole, the phosphor may contain a certain amount of impurities such as oxygen through partial oxidation, halogenation or the like, as long as the effects of the present invention are obtained. The chemical composition represented by Formula (2) may have any ratio (molar ratio) of oxygen/(oxygen+nitrogen) as long as the phosphor of the present invention that contains a crystal phase having the chemical composition represented by Formula (2) is obtained; however, the ratio (molar ratio) of oxygen/(oxygen+nitrogen) is usually 5% or less, preferably 1% or less, more preferably 0.5% or less, still more preferably 0.3% or less, particularly preferably 0.2% or less.

(Characteristics in TPD-MS Analysis)

In the nitride phosphor according to one embodiment of the second invention of the present invention, when the value of a difference between a minimum ionic strength and a maximum ionic strength in a range of 200 to 400° C. in a detection chart for a molecular weight (m/z) of 44 measured by TPD-MS analysis is defined as 1, the value of a difference between a minimum ionic strength and a maximum ionic strength in a range of 500 to 650° C. is 0.5 or larger. The value of the difference is preferably 0.6 or larger, more preferably 1.5 or larger, still more preferably 2.0 or larger.

Among released gases detected in the measurement of TPD (Thermal Programmed Desorption)-MS analysis, one having a molecular weight (m/z) of 44 is believed to be carbon dioxide gas. There have been reports focusing on water having a molecular weight (m/z) of 18 as in Patent Document 3; however, in the studies conducted by the present inventors, it was surprisingly discovered that the nitride phosphor according to one embodiment of the second invention of the present invention, which has a high brightness and is highly reliable, shows a characteristic feature in a detection chart for a molecular weight (m/z) of 44.

The TPD-MS analysis may be performed using a gas analyzer for phosphor analysis (manufactured by Cannon Anelva Corporation), and M-QA200TS (manufactured by Cannon Anelva Corporation) can be used as a mass spectrometer. The apparatus is not restricted thereto and, for example, a TPD analyzer manufactured by Rigaku Corporation may be used as well.

The measurement was performed using 0.05 g of a nitride phosphor sample while increasing the temperature to 1,000° C. at a heating rate of 33° C./min in a vacuum atmosphere ($5.0 \times 10^{-5}$ Pa or less). An ionic strength detection chart was obtained for a gas having a molecular weight (m/z) of 44 that was released in a temperature range of 30° C. to 1,000° C. Any data sampling interval may be employed; however, in order to clearly capture peaks in the detection chart, it is preferred to take the data from at least 80 points.

The detection charts for a molecular weight (m/z) of 44 that are shown in panel (a) of FIG. 4, which were obtained for conventional LSN phosphors (Comparative Examples 1-1 and 1-2) and an LSN phosphor according to one embodiment of the second invention of the present invention (Example 1-1), will now be described as examples.

These detection charts for a molecular weight (m/z) of 44 have plural peaks. The peaks are mainly observed at about 120° C., about 170° C., about 350° C., about 450° C., and about 600° C. Not all peaks appear clearly, and particularly distinct peaks are observed at three points of about 120° C., about 350° C., and about 600° C.

For extraction of the size of each peak, it is necessary to take into consideration that the peaks are not completely independent from each other and that particularly a low-temperature peak has a broad base and thus affects its adjacent peak(s). In order to eliminate this effect, the size of a peak is defined as the difference between a minimum ionic strength value and a maximum ionic strength value in the peripheral range of the peak. In the present application, the peak intensity is used as an index; however, a method using an integral value of a specific region around each peak, or a quantification method using a known substance may be employed as well.

The nitride phosphors according to one embodiment of the second invention of the present invention obtained in Examples below tend to have a lower ionic strength in substantially the entire temperature range as compared to the conventional nitride phosphors shown in Comparative Examples. For instance, in the above-described detection charts for a molecular weight (m/z) of 44, the value of the difference between the minimum ionic strength and the maximum ionic strength in a range of 200 to 400° C. is preferably less than 1.0, more preferably less than 0.3, still more preferably less than 0.2, when the value of the difference in Comparative Example 2-1 (nitride phosphor obtained without performing the heating step) is defined as 1. The value of the difference in ionic strength is a value obtained by TPD-MS analysis where 0.05 g of a sample (phosphor) is measured while being heated at a rate of 33° C./min in a vacuum atmosphere ($5.0 \times 10^{-5}$ Pa or less). It is also possible to employ a method of using a known sample or blending a known sample into a phosphor sample to determine the value of ionic strength. The above shows the values for a comparison of samples based on a premise that the samples are analyzed under the same conditions including the apparatus and analytical conditions; however, for example, a method using an integral value obtained for a range of 200 to 400° C. or the entire temperature range as an index, or a quantification method using a known substance may be employed as well.

However, since it is difficult to compare absolute values of ionic strength by this analysis method, a focus is given to the relative size of peaks observed in each temperature range. Referring to panel (b) of FIG. 4 which is an enlarged view of panel (a) of FIG. 4, for the nitride phosphor according to one embodiment of the second invention of the present invention, it is seen that particularly the peak at about 350° C. is notably low and a peak appears at about 600° C. The characteristics in the detection chart for a molecular weight (m/z) of 44 are not limited to this and, for example, although the peak at about 450° C. is not very conspicuous, a clear peak may be formed for the nitride phosphor according to one embodiment of the second invention of the present invention that has a good emission brightness in particular. Further, each peak truly represents the state of a phosphor and has its own meaning in that, for example, although the shoulder-shaped peak at about 170° C. appears clearly for the nitride phosphors of Comparative Examples, the peak is reduced for the nitride phosphor according to one embodiment of the second invention of the present invention.

A peak at a relatively low temperature is believed to represent physical adsorption of oxygen, carbon or a compound such as a carbonate, or release of carbon dioxide gas originating from an electrostatically weak bond. A peak at a relatively high temperature may be considered to represent oxygen, carbon or a compound such as a carbonate that is in a state of being bound with the phosphor surface, or release of carbon dioxide gas originating from such a compound in a strongly bound state inside the phosphor.

Particularly, the carbon dioxide gas originating from a weakly bound compound is continuously released in a temperature range reached by the phosphor during the use of a light-emitting device, and this causes a reduction in the brightness and reliability of the phosphor or the light-emitting device using the phosphor. Such an easily degradable phosphor that releases a gas at a relatively low temperature is itself believed to be readily deteriorated. Basically, a phosphor that releases carbon dioxide gas in the smallest amount possible is preferred and, even if the phosphor releases carbon dioxide gas, it is preferred that the phosphor hardly release carbon dioxide gas until it reaches a higher temperature. From another point of view, it is believed that a highly reliable phosphor having a high brightness is characterized by being in a state of releasing a gas at a higher temperature.

(Internal Quantum Efficiency)

The internal quantum efficiency is described in, for example, the paragraphs [0068] to [0083] of Patent Document 1, and generally determined by the following formula:

Internal quantum efficiency (%)=Number of photons emitted from phosphor/Number of photons absorbed by phosphor×100

In other words, the value of the internal quantum efficiency takes into account the ease of extracting a light from a phosphor and, since the light extraction efficiency is improved in a phosphor with limited desorption of a specific substance as in the case of the nitride phosphor according to one embodiment of the second invention of the present invention, the value of the internal quantum efficiency is increased as a result. Therefore, the nitride phosphor according to one embodiment of the second invention of the present invention has a high internal quantum efficiency of preferably 90% or higher.

The number of photons used in the measurement of the internal quantum efficiency can be determined using a spectrophotometer such as MCPD2000 or MCPD7000 manufactured by Otsuka Electronics Co., Ltd. The details of a measurement method are described below in the section of Examples.

The characteristic features of the nitride phosphor according to one embodiment of the second invention of the present invention enable to achieve the above-described internal quantum efficiency, and a production method thereof will be described later.

(Brightness)

The nitride phosphor according to one embodiment of the second invention of the present invention has a high relative brightness of preferably 130 or higher, more preferably 138 or higher. The relative brightness is a value determined by taking the Y value in the XYZ color system of a YAG (manufactured by Kasei Optonix Co., Ltd.; product number: P46-Y3) excited with a light having a wavelength of 455 nm as a reference value of 100.

(Production of Semiconductor Light-Emitting Device for Evaluation)

The nitride phosphor according to one embodiment of the second invention of the present invention has a high internal quantum efficiency and is thus suitable for the use in a semiconductor light-emitting device, exhibiting a good emission efficiency.

The semiconductor light-emitting device is produced as follows. First, the phosphor, a resin and a dispersant are weighed and mixed to obtain a phosphor-containing composition. Next, using a dispenser or the like, the thus obtained phosphor-containing composition is injected into recesses of a resin package on which blue LEDs are arranged. Thereafter, the phosphor-containing composition is heat-cured to obtain a semiconductor light-emitting device. The thus obtained semiconductor light-emitting device is set in an integrating sphere, and the chromaticity is measured using a spectrophotometer.

(Reliability)

The nitride phosphor according to one embodiment of the second invention of the present invention shows limited desorption of a specific substance such as carbon dioxide gas and thus hardly affects a sealant or a light-emitting element over time. In addition, the nitride phosphor according to one embodiment of the second invention of the present invention shows only a small reduction in brightness and a minor change in chromaticity in the long-term use, i.e. the nitride phosphor according to one embodiment of the second invention of the present invention is highly reliable. For example, when a semiconductor light-emitting device produced in the above-described manner is energized at 350 mA and illuminated for 100 hours in an incubator at 85° C. and 85% RH, the reliability can be evaluated by determining the amount of change in the emission efficiency before and after illumination (emission efficiency retention rate) as well as the amount of change in the value of chromaticity x or chromaticity y before and after illumination ($\Delta x$ or $\Delta y$). The higher the emission efficiency after a lapse of time, the less is the deterioration of the nitride phosphor and the higher is the reliability. Further, since a nitride phosphor emitting a yellow light largely contributes to the value of chromaticity y, the smaller the absolute value of $\Delta y$, the less is the deterioration of the nitride phosphor and the higher is the reliability.

Since it is preferred that the nitride phosphor according to one embodiment of the second invention of the present invention have a high emission efficiency when used as an LED phosphor in a semiconductor light-emitting device, the nitride phosphor according to one embodiment of the second invention of the present invention preferably has a high brightness. In addition, the nitride phosphor according to one embodiment of the second invention of the present invention is preferred to be highly reliable as well since an LED is used over a longer period than conventional incandescent light bulbs, cold-cathode tubes and the like. The $\Delta y$ (value of chromaticity y after 100-hour illumination—value of chromaticity y before illumination) is preferably −0.003 to 0, more preferably −0.002 to 0.

<5. Method of Producing Nitride Phosphor 2>

A method of producing the nitride phosphor according to one embodiment of the second invention of the present invention is not particularly restricted as long as the nitride phosphor according to one embodiment of the second invention of the present invention and the effects thereof can be obtained, and examples of the method include one in which a heat treatment is performed in an atmosphere having a low oxygen content at a temperature higher than in a conventional method. Specifically, the below-described production method of the present invention is one particularly preferred example.

A method of producing the nitride phosphor according to one embodiment of the second invention of the present invention (hereinafter, may be referred to as "the production method according to the second invention") is a method of producing a nitride phosphor that contains a crystal phase having a chemical composition represented by the above-described Formula (2) and includes: the step of preparing a raw material mixture of the nitride phosphor that contains a crystal phase having a chemical composition represented by Formula (2); the firing step of firing the thus obtained raw material mixture; and the heating step of heating the fired product obtained in the firing step in an atmosphere having an oxygen content of not higher than 10,000 ppm or in an atmosphere having a water content of 10.0% by volume or less.

In embodiments of the second invention of the present invention, the term "fired product" refers to a product obtained after the firing step. The term "fired product" encompasses not only a fired product obtained immediately after the firing step, but also a fired product that has been subjected to "2-3. Washing Step" performed prior to the below-described "2-4. Heating Step", and "2-5. Other Treatment Steps".

These steps will now be sequentially described.

(5-1. Preparation Step)

(Raw Materials)

Examples of raw materials (M source and Si source) used in the production method according to the second invention include metals, alloys and compounds, which contain constituent elements M and Si of the matrix of the nitride phosphor and, as required, an element(s) added for adjustment of the emission wavelength and the like, or Z that is an activator element.

Examples of compounds used as the M source and the Si source include nitrides, oxides, hydroxides, carbonates, nitrates, sulfates, oxalates, carboxylates, and halides of the elements constituting the nitride phosphor. Specific types of the compounds may be selected as appropriate from these metal compounds, taking into consideration, for example, the reactivity to an intend product and the low amounts of $NO_x$, $SO_x$ and the like generated during firing; however, from the standpoint that the nitride phosphor according to one embodiment of the second invention of the present invention is a nitride-containing phosphor, it is preferred to use a nitride and/or an oxynitride. Particularly, a nitride is preferably used since it also serves as a nitrogen source.

Specific examples of the nitride and the oxynitride include nitrides of nitride phosphor-constituting elements such as LaN, $Si_3N_4$ and CeN, and composite nitrides of nitride phosphor-constituting elements such as $La_3Si_6N_{11}$ and $LaSi_3N_5$.

The above-described nitride may contain a trace amount of oxygen. The nitride may have any ratio (molar ratio) of oxygen/(oxygen+nitrogen) as long as the nitride phosphor according to one embodiment of the second invention of the present invention can be obtained; however, excluding the oxygen derived from adsorbed water, the ratio (molar ratio) of oxygen/(oxygen+nitrogen) is usually 5% or less, preferably 1% or less, more preferably 0.5% or less, still more preferably 0.3% or less, particularly preferably 0.2% or less. An excessively high ratio of oxygen in the nitride may cause a reduction in the brightness.

Further, it is preferred to use the matrix of the nitride phosphor or the nitride phosphor itself as a part of a raw material. Since the matrix of the nitride phosphor or the nitride phosphor has already completed the reaction to become the matrix of the resulting nitride phosphor and thus only contributes to growth, it is unlikely to generate reaction heat or the like and, when nitridation of other raw material starts to run out of control, it inhibits reaction runaway and functions to dissipate heat; therefore, it is preferred to add the matrix of the nitride phosphor or the nitride phosphor itself in an amount of about 1 to 10% by mass of all raw materials.

When an oxide or the like is used, particularly when the oxide or the like is used in a large amount, in order to prevent oxygen from being incorporated into the resulting nitride phosphor more than necessary, it is preferred to devise a measure for removal of oxygen by, for example, performing superheating in an ammonia-containing or hydrogen-containing atmosphere in an early stage of firing. As the above-described raw materials, the various materials described in Patent Documents 1 and 2 (WO 2008/132954 and WO 2010/114061) can be used. Particularly, a method using an alloy is described in detail in Patent Document 2. Needless to say, an alloy may be used along with a flux added as a growth aid. As descriptions of this flux, the descriptions of "flux" relating to the production method according to the first invention are applied.

(Mixing of Raw Materials)

When an alloy for nitride phosphor production is used, as long as the composition ratio (molar ratio) of the metal elements in the resulting mixture matches the composition ratio of the metal elements contained in the crystal phase having the chemical composition represented by Formula (2), the alloy for nitride phosphor production may be fired alone, or the alloy for nitride phosphor production may be mixed with a flux as required and then fired.

On the other hand, when an alloy for nitride phosphor production is not used or the composition ratio of the metal elements in the resulting mixture does not match the composition ratio of the metal elements contained in the crystal phase having the chemical composition represented by Formula (2), an alloy for nitride phosphor production is mixed with an alloy for nitride phosphor production that has a different composition, a simple metal, a metal compound or the like, whereby the composition of the metal elements contained in the raw materials is adjusted to match the composition of the metal elements contained in the crystal phase having the chemical composition represented by Formula (2) before performing firing.

The composition of the raw materials may be modified within a range of about 0.5 to 2 times of a theoretical composition. In the case of the nitride phosphor according to one embodiment of the second invention of the present invention, the theoretical composition ratio of M and Si is 1:2. A compound having a composition ratio of 1:3 exists as a compound having a similar composition ratio (molar ratio); therefore, in order to inhibit the generation of such a compound, it is preferred to increase the molar ratio of M. Such a modification of the molar ratio is particularly preferred when the ratio of oxygen is high in the raw materials.

Mixing of the nitride phosphor raw materials may itself be performed by any known method. For example, a method of adding the raw materials to a pot along with a solvent and subsequently mixing the raw materials while crushing them with balls or a method of dry-mixing the raw materials and subsequently sieving the resulting mixture may be particularly preferably employed. When the raw materials are dispersed and mixed in a solvent, the solvent is removed as a matter of course and, as required, the resulting dry aggregates are pulverized. These operations are performed preferably in a nitrogen atmosphere.

Further, when the nitride phosphor according to one embodiment of the second invention of the present invention is produced by performing firing multiple times, it is preferred to add and thoroughly mix the flux by, for example, passing them through a sieve, prior to a step performed at the highest firing temperature.

(5-2. Firing Step)

The thus obtained raw material mixture is usually charged to a container such as a crucible or a tray, which is subsequently set in a heating furnace whose atmosphere can be controlled. Examples of the material of the container used in this process include boron nitride, silicon nitride, carbon, aluminum nitride, molybdenum, and tungsten. Thereamong, molybdenum and boron nitride are preferred from the standpoint of obtaining a nitride phosphor having excellent corrosion resistance. Any of the above-exemplified materials may be used individually, or two or more thereof may be used in any combination and at any ratio. When the raw material mixture is fired multiple times, the crucible used for firing performed at a relatively low temperature has a high degree of freedom and may be made of, for example, a ceramic material such as boron nitride, alumina or zirconia; a metal material such as molybdenum or tungsten; or a composite material obtained by coating the inside of a boron nitride crucible with a paste of molybdenum or the like.

A fired product used in the second invention of the present invention can be obtained by firing the raw material mixture.

The firing temperature is most preferably a temperature at which generation of the matrix of the nitride phosphor is initiated and a nucleus for the subsequent crystal growth is generated. Although the firing temperature slightly varies depending on the raw materials and the pressure, the lower limit value thereof is preferably 1,100° C. or higher, more preferably 1,250° C. or higher, most preferably 1,350° C. or higher. As for the lower limit value, even a lower temperature may be compensated by an increase in the firing time, as long as the growth of a nucleus takes place and the nucleus does not grow more than necessary. Meanwhile, from the standpoint of appropriately controlling the firing time, the upper limit value of the firing temperature is preferably 2,000° C. or lower, more preferably 1,800° C. or lower, most preferably 1,700° C. or lower. When firing is performed in an environment where the furnace gas pressure is higher than the atmospheric pressure, the suitable firing temperature shifts to the higher temperature side.

From the standpoints of the productivity and the control of crystal growth, the firing time is preferably 2 hours to 40 hours.

The conditions of firing, such as temperature, pressure and time, affect the below-described release of carbon dioxide gas. A residual raw material, reaction intermediate, and/or reaction byproduct may affect the subsequent heating step. In addition, the conditions of firing are important also in that they determine the quality of a fired product prior to the heating step. The crystal surface state and the degree of crystal growth affect the amount of released gas and the peak positions of a detection chart measured by TPD-MS analysis for a molecular weight (m/z) of 44.

The atmosphere in which firing is performed is preferably a nitrogen atmosphere or an ammonia atmosphere, more preferably an atmosphere in which nitrogen is mixed with 10% or less of hydrogen. A large amount of hydrogen poses a risk of explosion. Therefore, the amount of hydrogen is most preferably 4% or less.

In the case of performing firing multiple times, it is preferred to add a flux and the like as required to the resulting primary fired product and to subsequently, for example, re-disperse the resultant by grinding the resultant using a mortar or sieving the resultant, thereby inhibiting aggregation caused by heating, and improving the uniformity of the raw materials. These operations are preferably performed in a nitrogen atmosphere or an inert atmosphere. In this case, the oxygen concentration in the atmosphere is controlled at preferably 1% by volume or less, particularly preferably 100 ppm or less. A secondary and subsequent firing operations may be performed under firing conditions of the same ranges as those of the above-described primary firing; however, in order to allow crystals to grow efficiently, it is preferred to adopt the conditions described in WO 2010/114061 (Patent Document 2).

In this step, any firing apparatus can be used as long as the effects of the present invention are obtained; however, an apparatus in which the atmosphere can be controlled is preferred, and an apparatus in which the atmosphere and the pressure can both be controlled is more preferred. For example, a hot isotropic pressing device (HIP) or a vacuum-pressure atmosphere heating furnace is preferably used.

Further, prior to the initiation of heating, it is preferred to circulate a nitrogen-containing gas into the firing apparatus and thereby thoroughly replace the atmosphere in the system with the nitrogen-containing gas. If necessary, the system may be evacuated before circulating the nitrogen-containing gas.

(5-3. Heating Step)

The fired product obtained in the above-described firing step is heated in an atmosphere having an oxygen content of 10,000 ppm or less and/or in an atmosphere having a water content of 10.0% by volume or less, whereby a highly reliable nitride phosphor having a high brightness can be obtained.

The heating step can be performed by charging the fired product into a container such as a crucible or a tray, and subsequently setting and heating the container in a heating furnace whose atmosphere can be controlled.

As the material of the container used in this process, for example, a ceramic material such as quartz, boron nitride, alumina, zirconia, or silicon carbide; a metal material such as molybdenum or tungsten; or a composite material obtained by coating the inside of a boron nitride crucible with a paste of molybdenum or the like, can be used. Any of these materials may be used individually, or two or more thereof may be used in any combination.

As the heating furnace, any heating furnace can be used as long as the effects of the present invention are obtained; however, such an apparatus in which the atmosphere can be controlled as the one used in the above-described firing step is preferred, and an apparatus in which the atmosphere and the pressure can both be controlled is more preferred. For example, a hot isotropic pressing device (HIP) or a vacuum-pressure atmosphere heating furnace is preferably used.

The heating temperature in the heating step is preferably 500° C. or higher, more preferably 650° C. or higher, still more preferably 750° C. or higher, but preferably 1,300° C. or lower, more preferably 1,000° C. or lower. The heating temperature is preferably in this range in order to attain good brightness. This range is preferred since the gas release state is not improved at a lower temperature, while an excessively high temperature causes oxidation and decomposition.

In order to heat the whole fired product to a uniform temperature, the heating time in the heating step is preferably 1 hour or longer, more preferably 2 hours or longer, still more preferably 6 hours or longer; however, from the productivity standpoint, the heating time is preferably not longer than 80 hours, more preferably not longer than 50 hours.

From the productivity standpoint, the higher the rate of heating and cooling, the more preferred it is. On the other hand, by restricting the rate to be moderate, generation of a strain and cracking in the crystals are suppressed, so that the resulting nitride phosphor is allowed to maintain a good quality. Therefore, the rate of heating and cooling is preferably 100° C./min or slower, more preferably 5° C./min or slower, still more preferably 1° C./min or slower.

In the atmosphere inside the heating furnace, the oxygen content is usually 10,000 ppm or less, preferably 1,000 ppm or less, and a reduction in the oxygen content does not drastically improve the properties. Therefore, the oxygen content may be 10 ppm or higher, preferably 100 ppm or higher.

Examples of a method of adjusting the atmosphere inside the heating furnace to have an oxygen content of 10,000 ppm or less include a method of supplying a noble gas such as argon (Ar) or helium (He), or a nitrogen gas ($N_2$) into the heating furnace; a method of reducing the pressure inside the heating furnace to vacuum; and a method of using an oxygen-absorbing getter. A method of using an appropriate amount of hydrogen or ammonia may be employed as well; however, it is not necessary to use such a gas that poses a risk of explosion, and any of the above-exemplified methods that can be easily employed for the production is adequate. In addition, any of the above-exemplified methods of reducing the oxygen content may be used in combination with a method of increasing the oxygen content. Examples of the method of increasing the oxygen content include a method of supplying an appropriate amount of oxygen gas or the air; and a method of allowing an oxidizing compound such as a peroxide or an oxide, or an oxidizing solid to coexist in the heating furnace, or blending such an oxidizing compound or solid into the fired product.

The oxygen content in the heating furnace can be measured using a galvanic- or zirconia-type oxygen concentration meter. The measurement may be directly performed in the heating furnace; however, since the sensor is heavily worn out due to the high temperature in the heating furnace, a method of measuring a feed gas or a discharged gas may be employed as well.

In the heating step, the water content of the atmosphere inside the heating furnace may be 0% by volume; however, it is preferably 0% by volume or higher, more preferably 1.0% by volume or higher, but preferably 10.0% by volume or less, more preferably 4.0% by volume or less, still more preferably 3.0% by volume or less. It is preferred to control the water content of the atmosphere to be in the above-described range, since the brightness of the resulting nitride phosphor thereby tends to be improved.

Water can be supplied into the heating furnace by, for example, a method of passing the gas to be supplied into the furnace through a bubbler filled with water in advance and thereby introducing a water-containing gas; a method of using an appropriate amount of water vapor gas; or a method of allowing a compound capable of supplying water through degradation of a hydrate or a hydroxide to coexist in the heating furnace, or blending such a compound into the fired product. The water content of the atmosphere inside the heating furnace can be adjusted by, for example, adjusting the temperature of the bubbler through which the gas is passed through; adjusting the ratio of the gas passed through the bubbler and a gas not passed through the bubbler; or adjusting the amount of a coexisting material that releases water. In addition, the oxygen content and the water content of the atmosphere inside the heating furnace may be modified as appropriate during the heating step. When a method of using a coexisting material is employed, since the coexisting material is thermally degraded to release oxygen and/or water in some cases, the oxygen content and the water content of the atmosphere inside the heating furnace may be modified by adjusting the furnace temperature. Moreover, the oxygen content and the water content of the atmosphere inside the heating furnace may be modified by intentionally adjusting the oxygen content and the water content in the feed gas.

The above-described heating step does not have to be performed under a single condition and, for example, the heating step may be performed plural times in different atmospheres. Further, the heating step may be performed in combination with, as a pretreatment or a past-treatment, an existing heat treatment performed under a condition different from that of the heating step. Specifically, for example, as a pretreatment, a heat treatment can be performed in an atmosphere having an oxygen content and a water content that are not lower than the respective ranges of the heating step, and the heating step can be performed thereafter to obtain a favorable nitride phosphor. The terms "pretreatment" and "the heating step" used herein refer to the steps that may be performed separately from each other or may be performed as a series of steps while modifying the oxygen content and/or the water content in the atmosphere in the middle of heating.

The water content inside the heating furnace can be measured using a dew point meter. As in the case of measuring the oxygen content, the water content may be measured directly in the heating furnace; however, since the sensor is heavily worn out due to the high temperature in the heating furnace, a method of measuring a feed gas or a discharged gas may be employed as well.

As conventionally known in Patent Document 3 and the like, in the nitride phosphor of Formula (2), it was believed preferable to perform a vapor heat treatment at a relatively low temperature in an atmosphere containing a large amount of water in a saturated or substantially saturated state or to perform a highly reducing heat treatment in an atmosphere such as hydrogen-containing nitrogen or ammonia.

However, in the studies conducted by the present inventors, it was discovered that a nitride phosphor having both satisfactory emission brightness and satisfactory reliability can be obtained by reducing the oxygen concentration or the water content of the atmosphere inside the heating furnace to a certain extent and performing a relatively weakly reducing or weakly oxidizing heat treatment preferably at a higher temperature than in a conventional method. The atmosphere inside the heating furnace is preferably an atmosphere containing oxygen in such an amount that is expected to induce oxidation and deteriorate the quality, not an atmosphere containing oxygen in an extremely small amount. Moreover, it was a surprising discovery that a more favorable nitride phosphor can be produced by performing a heat treatment in a water-containing atmosphere under high-temperature and oxidizing conditions.

It is believed that this method is not restricted to the nitride phosphor (LSN phosphor) of Formula (2). This method is presumed to induce redox, termination and the like of a part of or a terminal of a silicon nitride skeleton. Therefore, this method is also applicable to a nitride phosphor having a silicon nitride skeleton.

(5-4. Other Treatment Steps)

In the production method according to the second invention, in addition to the above-described steps, other treatment step(s) may be performed as required. For example, the pulverization step, the washing step, the classification step, the drying step, the vapor heat treatment step, and/or the surface treatment step may be performed as required after the above-described firing step. In addition to these basic steps of a nitride phosphor production method, for example, the below-described vapor heat treatment may be performed as well.

The pulverization step, the washing step, the classification step, the drying step, the vapor heat treatment step and/or the surface treatment step may be performed before, during or after the above-described heating step; however, from the standpoint of maximizing the effects of the heating step, they are preferably performed before the heating step. Further, when a pretreatment or a post-treatment is performed before or after the heating step, the above-described other treatment steps may be performed before or after the pretreatment or the post-treatment.

As descriptions of the washing step, the descriptions of "2-3. Washing Step" relating to the production method according to the first invention are applied. Further, as descriptions of the pulverization step, the classification step, the drying step, the vapor heat treatment step and the surface treatment step, those descriptions of "Pulverization Step", "Classification Step", "Drying Step", "Vapor Heat Treatment Step" and "Surface Treatment Step" under the section of "Other Treatment Steps" relating to the production method according to the first invention are applied.

EXAMPLES

The present invention will now be described more concretely by way of Examples and Comparative Examples thereof; however, the present invention is not restricted to the below-described Examples by any means and can be modified arbitrarily within a range that does not depart from the gist of the present invention.

The emission properties and the like of the nitride phosphors of Examples and Comparative Examples were measured by the following methods.

(Powder X-ray Diffractometry)

In order to check if the desired nitride phosphor was obtained, a crystal phase was identified by powder X-ray diffractometry (XRD).

The XRD was precisely performed using a powder X-ray diffractometer X'Pert PRO MPD (manufactured by Panalytical Ltd.). The measurement conditions were as follows:

Using CuKα tube;
X-ray output=45 kV, 40 mA;
Scanning range 2θ=10° to 1500; and
Reading width=0.008°

(Infrared Absorption (FT-IR) Analysis)

In FT-IR analysis, an infrared absorption spectrum was measured by a diffuse reflection method using VERTEX70v manufactured by Bruker Optics K.K.

In the measurement, a mirror surface was used as a background, and measured values were corrected using a value at 4,000 cm$^{-1}$ as a baseline, followed by Kubelka-Munk conversion and normalization with a maximum intensity in a range of 1,165 to 1,185 cm$^{-1}$, whereby an absorption spectrum was obtained.

(Emission Spectrum)

An emission spectrum was measured using FP-6500 (manufactured by JASCO Corporation). The subject nitride phosphor was irradiated with an excitation light having a wavelength of 455 nm, and the emission intensity was measured at various wavelengths in a wavelength range of 380 nm to 780 nm using a spectrometer, followed by signal processing such as sensitivity correction using a personal computer, whereby an emission spectrum was obtained.

(Chromaticity)

For the determination of the chromaticity in an x-y color system (CIE 1931 color system), the spectral components of the excitation light were excluded from the emission spectrum obtained by the above-described method. Then, from the data in a wavelength range of 380 nm to 800 nm, the chromaticity coordinates x and y in the XYZ color system prescribed in JIS Z 8701 were calculated by a method according to JIS Z 8724.

(Relative Brightness I)

For Examples 1-1 to 1-6 and Comparative Examples 1-1 to 1-6, relative brightness I was determined.

The relative brightness I represents a value relative to the Y value in the XYZ color system, which Y value was determined by exciting the nitride phosphor obtained in Comparative Example 1-1 with a light having a wavelength of 455 nm and taken as a reference value of 100.

(Relative Brightness II)

For Examples 2-1 to 2-31 and Comparative Examples 2-1 to 2-3, relative brightness II was determined.

The relative brightness II represents a value determined by taking the Y value in the XYZ color system of a YAG (manufactured by Kasei Optonix Co., Ltd.; product number: P46-Y3) excited with a light having a wavelength of 455 nm as a reference value of 100. The higher the relative brightness II, the more preferred it is.

It is noted here that the some of the results were indicated in terms of relative brightness II that was determined based on a value calculated as described above, taking the Y value of the nitride phosphor of Comparative Example 2-1 as a reference value of 100.

(Internal Quantum Efficiency)

The internal quantum efficiency (ηi) of a nitride phosphor was determined as follows.

The nitride phosphor was weighed along with 0.80 g of a silicone resin (KER-2500) manufactured by Shin-Etsu Chemical Co., Ltd. and 0.04 g of AEROSIL (RX200) manufactured by Nippon Aerosil Co., Ltd., and these materials were mixed using a stirring/defoaming apparatus AR-100 manufactured by Thinky Corporation to obtain a nitride phosphor-containing composition. The amount of the nitride phosphor was adjusted as appropriate in such a manner to yield a chromaticity y value of 0.35 in the measurement performed on a test chip in accordance with the below-described method of reliability test II based on LED evaluation.

The nitride phosphor-containing composition was cured to obtain a quantum efficiency measurement sample.

This quantum efficiency measurement sample was set in an integrating sphere, and the nitride phosphor sample to be measured was irradiated using a laser diode having a wavelength of 445 nm as a light source to measure the spectrum for the emission (fluorescence) and reflected light of the nitride phosphor sample using a spectrophotometer (manufactured by Spectra Co-op). The light inside the integrating sphere was guided to the spectrophotometer by means of an optical fiber.

The number of photons ($N_{abs}$) of the excitation light absorbed by the nitride phosphor sample is proportional to the amount calculated by the following Formula (b).

$$\frac{1}{R}\int \lambda \cdot I_{ref}(\lambda)d\lambda - \int \lambda \cdot I(\lambda)d\lambda \tag{式b}$$

Thus, as a measurement subject, "SPECTRALON" manufactured by Labsphere, Inc. (having a reflectance R of 98% against an excitation light of 450 nm), which is a reflector having a reflectance R of substantially 100% against the excitation light, was installed in the above-described integrating sphere in the same arrangement as the nitride phosphor sample and irradiated with the excitation light, and the reflection spectrum I (λ) was measured by a spectrophotometer. The integration interval of Formula (b) was set to be 410 nm to 480 nm for an excitation wavelength of 445 nm. The actual measured spectral values are generally obtained as digital data divided into finite band widths relating to λ; therefore, integration of the Formula (b) was obtained by summation based on the band widths.

Next, the internal quantum efficiency ηi was determined as a value obtained by dividing the number of photons derived from fluorescence phenomenon ($N_{PL}$) by the number of photons absorbed by the nitride phosphor sample ($N_{abs}$).

The $N_{PL}$ is proportional to the amount calculated by the following Formula (c). Thus, the amount calculated by the following Formula (c) was determined.

$$\int \lambda \cdot I(\lambda) d\lambda \quad \text{式}_c$$

The integration interval was set to be 470 nm to 850 nm for an excitation wavelength of 445 nm.

From the above, ηi=(Formula c)/(Formula b) was calculated to determine the internal quantum efficiency (ηi).

It is noted here that integration from the spectrum obtained as digital data was performed in the same manner as the integration of Formula (b).

(TPD-MS Analysis)

For TPD-MS analysis, a gas analyzer for nitride phosphor analysis (manufactured by Cannon Anelva Corporation) and a mass spectrometer M-QA200TS (manufactured by Cannon Anelva Corporation) were used.

The measurement was performed at 90 points while heating 0.05 g of the subject nitride phosphor to 1,000° C. at a heating rate of 33° C./min in a vacuum atmosphere ($5.0 \times 10^{-5}$ Pa). An ionic strength detection chart of a gas having a molecular weight (m/z) of 44 that was released in a temperature range of 30° C. to 1,000° C. was thereby obtained.

In the thus obtained detection chart for a molecular weight (m/z) of 44, the value of the difference between the minimum ionic strength and the maximum ionic strength in a range of 500 to 650° C. was calculated, taking the value of the difference between the minimum ionic strength and the maximum ionic strength in a range of 200 to 400° C. as 1.

(Reliability Test Based on LED Evaluation)

A blue light-emitting diode (LED) chip having an emission wavelength of 445 nm to 455 nm was adhered to a terminal on the bottom of a recess of a package with a silicone resin-based transparent die bonding paste. The package was subsequently heated at 150° C. for 2 hours to cure the transparent die bonding paste, after which the blue light LED chip and electrodes of the package were wire-bonded using a gold wire of 25 μm in diameter.

Meanwhile, the nitride phosphor, a silicone resin (KER-2500) manufactured by Shin-Etsu Chemical Co., Ltd., and AEROSIL (RX200) manufactured by Nippon Aerosil Co., Ltd. were weighed and mixed using a stirring/deforming apparatus to obtain a nitride phosphor-containing resin paste. The amount of this resin paste was adjusted such that a CIE y value of 0.352 was obtained in combination with the emission of the blue LED chip, and the resin paste was integrated with the LED chip to obtain a desired semiconductor light-emitting device.

The blue LED chip of the thus obtained semiconductor light-emitting device was energized at 350 mA and thereby illuminated and, from the resulting emission spectrum, the chromaticity values x and y in the XYZ color system prescribed in JIS Z 8701 as well as the conversion efficiency (lm/W) were determined.

At room temperature and in an incubator having a temperature of 85° C. at 85% RH, the blue LED chip of the above-prepared semiconductor light-emitting device was energized at 350 mA and illuminated for 100 hours, and the amount of change in the value of chromaticity y (Δy) before and after the illumination was calculated.

Comparative Example 1-1

Preparation to Charging of Raw Materials

LaSi (particle size: 8.5 μm), $Si_3N_4$(SN-E10 manufactured by Ube Industries, Ltd.) and $CeF_3$ (manufactured by Kojundo Chemical Laboratory Co., Ltd.) were weighed in a glove box having a nitrogen atmosphere with an oxygen concentration of 1% by volume or less such that a molar ratio (La:Si:Ce) of 3.1:6.0:0.2 was attained. Then, the thus weighed raw materials were thoroughly mixed, and the resulting mixed powder was charged to a molybdenum crucible.

(Firing Step)

The molybdenum crucible charged with the raw material mixed powder was placed in an electric furnace. After evacuating the inside of the furnace to vacuum, the furnace was heated to 120° C., and a hydrogen-containing nitrogen gas (nitrogen:hydrogen=96:4 (volume ratio)) was introduced into the furnace until the atmospheric pressure was attained. Subsequently, the furnace temperature was raised to 1,550° C., after which the furnace was retained at 1,550° C. for 8 hours and then cooled, whereby a nitride phosphor was obtained.

(Washing Step)

The thus fired nitride phosphor was passed through a sieve, pulverized using a ball mill, and subsequently washed with 1N hydrochloric acid, after which the resultant was dehydrated, dried in a 120° C. hot-air dryer, and then passed through a sieve having 63-μm openings. The thus obtained nitride phosphor was defined as the nitride phosphor of Comparative Example 1.

Comparative Example 1-2

A nitride phosphor of Comparative Example 1-2 was obtained by performing the following vapor heat treatment after the washing step of Comparative Example 1-1.

(Vapor Heat Treatment)

The nitride phosphor powder obtained after the above-described washing step was placed in a glass sample jar, and this sample jar was placed in an autoclave (PC-305 manufactured by Hirayama Manufacturing Corporation) to treat the nitride phosphor powder for 14 hours under a saturated water vapor at 158° C. and 0.33 MPa. Subsequently, the resultant was dried for 2 hours in a 140° C. hot-air dryer and then passed through a sieve having 63-μm openings, whereby the desired nitride phosphor powder was obtained.

Example 1-1

A nitride phosphor of Example 1-1 was obtained by performing the following low-temperature heating step after the washing step of Comparative Example 1-1.

(Low-Temperature Heating Step)

The nitride phosphor powder obtained after the above-described washing step was charged to a boron nitride (BN) crucible, and this crucible was placed in an electric furnace. After evacuating the inside of the furnace to vacuum, a nitrogen gas was introduced into the furnace until the atmospheric pressure was attained. Subsequently, the furnace temperature was raised to 900° C., after which the furnace was retained for 2 hours and then cooled, whereby the desired nitride phosphor powder was obtained.

Example 1-2

A nitride phosphor of Example 1-2 was obtained under the same conditions as in Example 1-1, except that, in the low-temperature heating step of Example 1-1, the nitrogen gas was circulated through a water-filled bubbler in advance and thereby adjusted to have a water content of 1.1% by volume.

Example 1-3

A nitride phosphor of Example 1-3 was obtained under the same conditions as in Example 1-1, except that, in the low-temperature heating step of Example 1-1, the furnace temperature was raised to 1,100° C. and the furnace was retained for 2 hours and then cooled.

XRD measurement was performed for the above-described nitride phosphors of Comparative Examples 1-1 and 1-2 and Examples 1-1 to 1-3. As a result, the thus obtained diffraction patterns each showed only $La_3Si_6N_{11}$ forming a tetragonal crystal, and it was thus confirmed that a crystal phase having the desired chemical composition was produced.

With regard to Comparative Examples 1-1 and 1-2 and Examples 1-1 to 1-3, Table 1 shows the positions of absorption peaks (maximum points) in a range of 3,720 to 3,760 $cm^{-1}$ as well as the positions of absorption peaks in a range of 3,200 to 3,300 $cm^{-1}$ in the respective FT-IR spectra, and Table 2 shows the height of each absorption peak determined by the above-described Formula (I) as well as the values obtained by dividing the height of each absorption peak by a standard deviation ($\sigma$) of values measured in a range of 3,900 to 4,000 $cm^{-1}$

TABLE 1

FT-IR Peak Positions of Comparative Examples 1-1 and 1-2 and Examples 1-1 to 1-3

|  | Absorption peak position at 3,720 to 3,760 $cm^{-1}$ | Absorption peak position at 3,200 to 3,300 $cm^{-1}$ |
|---|---|---|
| Comparative Example 1-1 | none | none |
| Comparative Example 1-2 | none | 3,285 $cm^{-1}$ |
| Example 1-1 | 3,738 $cm^{-1}$ | 3,236, 3,268, 3,285 $cm^{-1}$ |
| Example 1-2 | 3,742 $cm^{-1}$ | 3,239, 3,268, 3,288 $cm^{-1}$ |
| Example 1-3 | 3,742 $cm^{-1}$ | 3,239, 3,268, 3,288 $cm^{-1}$ |

TABLE 2

Height (H) and H/$\sigma$ Value of Each Absorption Peak

|  | Wavenumber ($cm^{-1}$) | Height (H) | H/$\sigma$ |
|---|---|---|---|
| Comparative Example 1-1 | none | — | — |
| Comparative Example 1-2 | 3,285 | $1.3 \times 10^{-4}$ | 32.4 |
| Example 1-1 | 3,738 | $1.5 \times 10^{-4}$ | 174.5 |
|  | 3,285 | $2.3 \times 10^{-5}$ | 27.6 |
|  | 3,268 | $2.2 \times 10^{-5}$ | 26.5 |
|  | 3,236 | $2.2 \times 10^{-5}$ | 25.9 |
| Example 1-2 | 3,742 | $3.4 \times 10^{-5}$ | 432.2 |
|  | 3,288 | $8.1 \times 10^{-5}$ | 1,039.2 |
|  | 3,268 | $4.2 \times 10^{-5}$ | 542.2 |
|  | 3,239 | $6.3 \times 10^{-5}$ | 809.7 |

TABLE 2-continued

Height (H) and H/$\sigma$ Value of Each Absorption Peak

|  | Wavenumber ($cm^{-1}$) | Height (H) | H/$\sigma$ |
|---|---|---|---|
| Example 1-3 | 3,742 | $2.9 \times 10^{-5}$ | 145.1 |
|  | 3,288 | $1.1 \times 10^{-5}$ | 56.5 |
|  | 3,268 | $3.1 \times 10^{-5}$ | 159.2 |
|  | 3,239 | $1.6 \times 10^{-5}$ | 79.3 |

Figure 1:
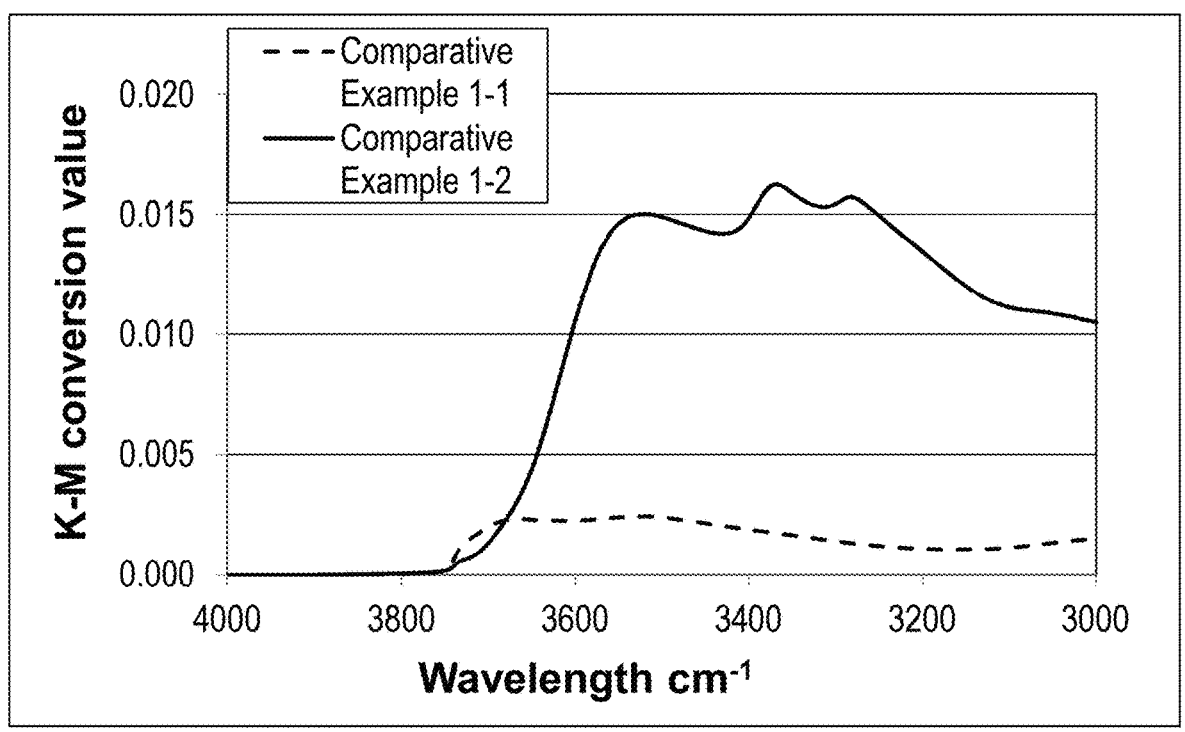
FIG. 1 shows infrared absorption spectra of the phosphors of Comparative Examples 1-1 and 1-2.

Further, FIG. 1 shows the infrared absorption spectra of Comparative Examples 1-1 and 1-2, and FIG. 2 shows the infrared absorption spectra of Examples 1-1 to 1-3.

It is seen that both Comparative Examples 1-1 and 1-2 had a broad absorption peak in a range of 3,000 to 3,800 $cm^{-1}$. This absorption peak is believed to be derived from a hydrogen-binding OH group and indicate so-called water adsorption. It is suggested that the nitride phosphor of Comparative Example 1-2, which was subjected to a vapor heat treatment, had a greater amount of water adsorption.

Meanwhile, with regard to Examples 1-1 to 1-3, in addition to an absorption peak derived from slight water adsorption, a single sharp absorption peak and three sharp absorption peaks are observed in a range of 3,700 to 3,800 $cm^{-1}$ and in a range of 3,200 to 3,300 $cm^{-1}$, respectively. It is believed that the absorption peak at 3,700 to 3,800 $cm^{-1}$ was derived from Si—OH and the plural absorption peaks at 3,200 to 3,300 $cm^{-1}$ were derived from —NH. The reason why the plural narrow absorption peaks appeared is because the —NH existed in an environment where the structure is controlled, i.e. in the form of being integrated into a crystal structure, and the interactions with each of the plural surrounding ions were observable.

With regard to Comparative Examples 1-1 and 1-2 and Examples 1-1 to 1-3, Table 3 shows the emission chromaticity, the relative brightness, and the results of the reliability test based on LED evaluation.

TABLE 3

Optical Properties of Comparative Examples 1-1 and 1-2 and Examples 1-1 to 1-3

|  | Chromaticity (x) | Chromaticity (y) | Relative brightness (%) | $\Delta y$ |
|---|---|---|---|---|
| Comparative Example 1-1 | 0.417 | 0.559 | 100 | 0.0016 |
| Comparative Example 1-2 | 0.415 | 0.561 | 118 | −0.0028 |
| Example 1-1 | 0.417 | 0.560 | 119 | 0.0001 |
| Example 1-2 | 0.417 | 0.560 | 122 | −0.0010 |
| Example 1-3 | 0.417 | 0.561 | 129 | −0.0003 |

As shown in Table 3, as compared to Comparative Example 1-1, the relative brightness was improved but the change in chromaticity ($\Delta y$) was larger in Comparative Example 1-2. The result of FT-IR confirms that the nitride phosphor of Comparative Example 1-2 had a large amount of adsorbed water, and it is believed that this adsorbed water filled the surface defects of the nitride phosphor to improve the powder brightness. It is also believed, however, that the emission of the nitride phosphor gradually decreased as the surface adsorbed water filling the defects was gradually reduced by the long-term use, resulting an increase in the change in chromaticity on LED.

On the other hand, it is seen that, in Examples 1-1 to 1-3, not only the relative brightness was improved, but also the change in chromaticity ($\Delta y$) was small and both brightness and reliability were improved in the reliability test based on LED evaluation. The bonds observed in the FT-IR measurement of Examples 1-1 to 1-3, such as Si—OH and —NH, are presumed to function in such a manner to fill the point defects such as dangling bonds generated during firing of each nitride phosphor, and this is believed to result in an improvement in brightness. In addition, the absorption peaks observed in the FT-IR spectra are narrow in width and the bonds are believed to be integrated into the crystal structure; therefore, it is expected that the bonds do not disappear even in the long-term use and the effects are thus maintained.

Comparative Example 1-3

A nitride phosphor of Comparative Example 1-3 was obtained under the same conditions as in Comparative Example 1-2, except that the starting raw materials were changed to LaN, $Si_3N_4$ and $CeF_3$.

Example 1-4

A nitride phosphor of Example 1-4 was obtained under the same conditions as in Comparative Example 1-3, except that, in place of the vapor heat treatment of Comparative Example 1-3, a low-temperature heat treatment was performed in a nitrogen atmosphere at 900° C. and the furnace was retained for 6 hours.

Comparative Example 1-4

A nitride phosphor of Comparative Example 1-4 was obtained under the same conditions as in Comparative Example 1-2, except that LaSi, $Si_3N_4$, $CeF_3$ and $CeO_2$ were used as starting raw materials and these raw materials were weighed and mixed such that a molar ratio (La:Si:Ce) of 3.1:6.0:0.3 and a molar ratio ($CeF_3$:$CeO_2$) of 2:1 were attained.

Example 1-5

A nitride phosphor of Example 1-5 was obtained under the same conditions as in Comparative Example 1-4, except that, in place of the vapor heat treatment of Comparative Example 1-4, a low-temperature heat treatment was performed in a nitrogen atmosphere at 900° C. and the furnace was retained for 12 hours.

XRD measurement was performed for the above-described nitride phosphors of Comparative Examples 1-3 and 1-4 and Examples 1-4 and 1-5. As a result, the thus obtained diffraction patterns each showed only $La_3Si_6N_{11}$ forming a tetragonal crystal, and it was thus confirmed that a crystal phase having the desired chemical composition was produced. FIG. 9 shows the XRD measurement result of the nitride phosphor of Example 1-5.

With regard to Comparative Examples 1-3 and 1-4 and Examples 1-4 and 1-5, Table 4 shows the positions of absorption peaks in a range of 3,720 to 3,760 $cm^{-1}$ as well as the positions of absorption peaks in a range of 3,200 to 3,300 $cm^{-1}$ in the respective FT-IR spectra, and Table 5 shows the height of each absorption peak determined by the above-described Formula (I) as well as the values obtained by dividing the height of each absorption peak by a standard deviation (σ) of values measured in a range of 3,900 to 4,000 $cm^{-1}$.

TABLE 4

FT-IR Peak Positions of Comparative Examples 1-3 and 1-4 and Examples 1-4 and 1-5

|  | Absorption peak position at 3,720 to 3,760 $cm^{-1}$ | Absorption peak position at 3,200 to 3,300 $cm^{-1}$ |
|---|---|---|
| Comparative Example 1-3 | None | 3,281 $cm^{-1}$ |
| Comparative Example 1-4 | None | 3,281 $cm^{-1}$ |
| Example 1-4 | 3,742 $cm^{-1}$ | 3,239, 3,268, 3,288 $cm^{-1}$ |
| Example 1-5 | 3,742 $cm^{-1}$ | 3,239, 3,268, 3,288 $cm^{-1}$ |

TABLE 5

Height (H) and H/σ Value of Each Absorption Peak

|  | Wavenumber ($cm^{-1}$) | Height (H) | H/σ |
|---|---|---|---|
| Comparative Example 1-3 | 3,281 | $2.5 \times 10^{-1}$ | 138,390.2 |
| Comparative Example 1-4 | 3,281 | $1.1 \times 10^{-4}$ | 46.6 |
| Example 1-4 | 3,742 | $3.5 \times 10^{-5}$ | 170.4 |
|  | 3,288 | $9.2 \times 10^{-5}$ | 449.6 |
|  | 3,268 | $2.7 \times 10^{-4}$ | 1,329.5 |
|  | 3,239 | $4.5 \times 10^{-5}$ | 222.1 |
| Example 1-5 | 3,745 | $6.8 \times 10^{-5}$ | 139.5 |
|  | 3,288 | $2.3 \times 10^{-5}$ | 48.4 |
|  | 3,268 | $1.3 \times 10^{-4}$ | 274.0 |
|  | 3,239 | $3.4 \times 10^{-5}$ | 70.5 |

Also in Examples 1-4 and 1-5 where the combination of raw materials was different from the one used in Example 1-1, an absorption peak derived from Si—OH bond was observed in a range of 3,720 to 3,760 $cm^{-1}$, and plural absorption peaks derived from —NH were observed at 3,239, 3,268, 3,288 $cm^{-1}$.

Further, with regard to Comparative Examples 1-3 and 1-4 and Examples 1-4 and 1-5, Table 6 shows the emission chromaticity, the relative brightness, and the results of the reliability test based on LED evaluation.

TABLE 6

Optical Properties of Comparative Examples 1-3 and 1-4 and Examples 1-4 and 1-5

|  | Chromaticity (x) | Chromaticity (y) | Relative brightness (%) | Δy |
|---|---|---|---|---|
| Comparative Example 1-3 | 0.422 | 0.558 | 130 | −0.0035 |
| Comparative Example 1-4 | 0.425 | 0.556 | 130 | −0.0049 |
| Example 1-4 | 0.422 | 0.558 | 129 | −0.0016 |
| Example 1-5 | 0.425 | 0.556 | 131 | −0.0001 |

As shown in Table 6, in Examples 1-3 and 1-4 where absorption peaks derived from Si—OH and —NH were observed in the FT-IR analysis, as compared to Comparative Examples 1-3 and 1-4, the change in chromaticity in the reliability test was smaller while good relative brightness was maintained.

Comparative Example 1-5

A nitride phosphor of Comparative Example 1-5 was obtained under the same conditions as in Comparative Example 1-1, except that LaSi, $Si_3N_4$, $CeF_3$ and $Y_2O_3$ were used as starting raw materials and these raw materials were weighed and mixed such that a molar ratio (La:Si:Ce:Y) of 2.9:6.0:0.3:0.4 was attained.

Comparative Example 1-6

A nitride phosphor of Comparative Example 1-6 was obtained by performing a vapor heat treatment under the same conditions as in Comparative Example 1-2 after the washing step of Comparative Example 1-5.

Example 1-6

A nitride phosphor of Example 1-6 was obtained by, after the washing step of Comparative Example 1-5, performing a low-temperature heat treatment in a nitrogen atmosphere at 900° C. and retaining the furnace for 6 hours.

XRD measurement was performed for the above-described nitride phosphors of Comparative Examples 1-5 and 1-6 and Example 1-6. As a result, the thus obtained diffraction patterns each showed only $La_3Si_6N_{11}$ forming a tetragonal crystal, and it was thus confirmed that a crystal phase having the desired chemical composition was produced.

With regard to Comparative Examples 1-5 and 1-6 and Example 1-6, Table 7 shows the positions of absorption peaks in a range of 3,720 to 3,760 $cm^{-1}$ as well as the positions of absorption peaks in a range of 3,200 to 3,300 $cm^{-1}$ in the respective FT-IR spectra, and Table 8 shows the height of each absorption peak determined by the above-described Formula (I) as well as the values obtained by dividing the height of each absorption peak by a standard deviation (a) of values measured in a range of 3,900 to 4,000 $cm^{-1}$.

TABLE 7

FT-IR Peak Positions of Comparative Examples 1-5 and 1-6 and Example 1-6

|  | Absorption peak position at 3,720 to 3,760 $cm^{-1}$ | Absorption peak position at 3,200 to 3,300 $cm^{-1}$ |
|---|---|---|
| Comparative Example 1-5 | None | None |
| Comparative Example 1-6 | None | 3,278 $cm^{-1}$ |
| Example 1-6 | 3,745 $cm^{-1}$ | 3,232, 3,268 $cm^{-1}$ |

TABLE 8

Height (H) and H/σ Value of Each Absorption Peak

|  | Wavenumber ($cm^{-1}$) | Height (H) | H/σ |
|---|---|---|---|
| Comparative Example 1-5 | None | — | — |
| Comparative Example 1-6 | 3,278 | $5.3 \times 10^{-5}$ | 47.8 |
| Example 1-6 | 3,745 | $1.0 \times 10^{-4}$ | 736.2 |
|  | 3,268 | $2.7 \times 10^{-4}$ | 1,915.0 |
|  | 3,232 | $7.4 \times 10^{-5}$ | 533.4 |

Also in Example 1-6 where the matrix composition was changed to adjust the emission color, an absorption peak derived from Si—OH bond was observed in a range of 3,720 to 3,760 $cm^{-1}$, and plural absorption peaks derived from —NH were observed in a range of 3,200 to 3,300 $cm^{-1}$.

Further, with regard to Comparative Examples 1-5 and 1-6 and Example 1-6, Table 9 shows the emission chromaticity, the relative brightness, and the results of the reliability test based on LED evaluation.

TABLE 9

Optical Properties of Comparative Examples 1-5 and 1-6 and Example 1-6

|  | Chromaticity (x) | Chromaticity (y) | Relative brightness (%) | Δy |
|---|---|---|---|---|
| Comparative Example 1-5 | 0.458 | 0.532 | 105 | 0.0015 |
| Comparative Example 1-6 | 0.458 | 0.533 | 117 | −0.0019 |
| Example 1-6 | 0.456 | 0.534 | 115 | −0.0004 |

As shown in Table 9, it is seen that the nitride phosphor of Example 1-6, which was confirmed to have absorption peaks derived from Si—OH and —NH in the FT-IR analysis, satisfied both high brightness and good reliability.

Comparative Example 2-1

(Preparation of Raw Materials)

LaSi (particle size: 8.5 μm), $Si_3N_4$(SN-E10 manufactured by Ube Industries, Ltd.) and $CeF_3$ (manufactured by Kojundo Chemical Laboratory Co., Ltd.) were weighed such that a preparation composition had a molar ratio (La:Si) of 1:2 and a ratio $CeF_3$/(LaSi+$Si_3N_4$) of 6% by weight. The thus weighed raw materials were mixed and then charged to a molybdenum (Mo) crucible. It is noted here that these operations of weighing to charging were carried out in a glove box having a nitrogen atmosphere with an oxygen concentration of 1% by volume or less.

(Firing Step)

The Mo crucible charged with the thus prepared raw materials was placed in an electric furnace. After evacuating the inside of the furnace to vacuum, the furnace was heated to 120° C., and a hydrogen-containing nitrogen gas (nitrogen:hydrogen=96:4 (volume ratio)) was introduced into the furnace until the atmospheric pressure was attained. Subsequently, the furnace temperature was raised to 1,550° C., after which the furnace was retained at 1,550° C. for 8 hours and then cooled, whereby a nitride phosphor was obtained.

(Washing Step)

The thus fired nitride phosphor was passed through a sieve, pulverized using a ball mill, and subsequently washed with 1N hydrochloric acid, after which the resultant was dehydrated, dried in a 120° C. hot-air dryer, and then passed through a sieve having 63-μm openings.

A fired product obtained through the above-described steps was defined as the nitride phosphor of Comparative Example 2-1.

XRD measurement was performed for the nitride phosphor of Comparative Example 2-1. As a result, the thus obtained diffraction pattern showed only $La_3Si_6N_{11}$ forming a tetragonal crystal, and it was thus confirmed that a crystal phase having the desired chemical composition was produced.

The nitride phosphor of Comparative Example 2-1 was measured by TPD-MS analysis to obtain a detection chart for a molecular weight (m/z) of 44. When the value of the difference between the minimum ionic strength and the maximum ionic strength in a range of 200 to 400° C. was defined as 1, the value of the difference between the minimum ionic strength and the maximum ionic strength in a range of 500 to 650° C. (hereinafter, may be referred to as "value of high-temperature peak intensity/low-temperature peak intensity") was 0.1.

The relative brightness and the result of the reliability test are shown together in Table 10.

Example 2-1

The following heat treatment step was performed on a fired product obtained by performing the preparation of raw materials, the firing step and the washing step in the same manner as in Comparative Example 2-1.

(Heating Step)

The fired product obtained through the above-described washing step was charged to a boron nitride (BN) crucible, and this crucible was placed in an electric furnace. After evacuating the inside of the furnace to vacuum, a nitrogen gas having an oxygen concentration of 3 ppm was introduced into the heating furnace until the atmospheric pressure was attained. Subsequently, the furnace temperature was raised to 900° C., after which the furnace was retained for 12 hours and then cooled, whereby a nitride phosphor of Example 2-1 was obtained.

XRD measurement was performed for the nitride phosphor of Example 2-1. As a result, the thus obtained diffraction showed only $La_3Si_6N_{11}$ forming a tetragonal crystal, and it was thus confirmed that a crystal phase having the desired chemical composition was produced.

The nitride phosphor of Example 2-1 was measured by TPD-MS analysis to obtain a detection chart for a molecular weight (m/z) of 44. The value of high-temperature peak intensity/low-temperature peak intensity was 1.4. In addition, the ratio of the difference between the minimum ionic strength and the maximum ionic strength in a range of 200 to 400° C. of the nitride phosphor of Example 2-1 with respect to the difference between the minimum ionic strength and the maximum ionic strength in a range of 200 to 400° C. of the nitride phosphor of Comparative Example 2-1 (which difference was defined as 1.0) (this ratio may be hereinafter referred to as "low-temperature peak intensity ratio") was 0.1.

The relative brightness and the result of the reliability test are shown together in Table 10.

Examples 2-2 and 2-3

Nitride phosphors of Examples 2-2 and 2-3 were each obtained in the same manner as in Example 2-1, except that, in the heating step, the nitrogen gas was circulated through a water-filled bubbler in advance and thereby adjusted to have a water content of 1.1% by volume or 3.1% by volume as shown in Table 10 before being introduced into the heating furnace.

XRD measurement was performed for the above-described nitride phosphors of Examples 2-2 and 2-3. As a result, the thus obtained diffraction patterns each showed only $La_3Si_6N_{11}$ forming a tetragonal crystal, and it was thus confirmed that a crystal phase having the desired chemical composition was produced.

The nitride phosphors of Examples 2-2 and 2-3 were measured by TPD-MS analysis to obtain detection charts for a molecular weight (m/z) of 44. The nitride phosphors of Examples 2-2 and 2-3 had values of high-temperature peak intensity/low-temperature peak intensity of 6.2 and 1.8, respectively. In addition, for both of the nitride phosphors of Examples 2-2 and 2-3, the ratio (low-temperature peak intensity ratio) of the difference between the minimum ionic strength and the maximum ionic strength in a range of 200 to 400° C. with respect to the difference between the minimum ionic strength and the maximum ionic strength in a range of 200 to 400° C. of the nitride phosphor of Comparative Example 2-1 (which difference was defined as 1.0) was 0.1.

The relative brightness and the results of the reliability test are shown together in Table 10.

Comparative Example 2-2

The following vapor heat treatment was performed on a fired product obtained by performing the preparation of raw materials, the firing step and the washing step in the same manner as in Comparative Example 2-1.

(Vapor Heat Treatment)

The fired product obtained through the above-described washing step was placed in a glass sample jar, and this sample jar was placed in an autoclave (PC-305 manufactured by Hirayama Manufacturing Corporation). The fired product was treated for 14 hours under a saturated water vapor at 158° C. and 0.33 MPa. Subsequently, the resultant was dried for 2 hours in a 140° C. hot-air dryer to obtain a nitride phosphor of Comparative Example 2-2.

XRD measurement was performed for the nitride phosphor of Comparative Example 2-2. As a result, the thus obtained diffraction pattern showed only $La_3Si_6N_{11}$ forming a tetragonal crystal, and it was thus confirmed that a crystal phase having the desired chemical composition was produced.

The nitride phosphor of Comparative Example 2-2 was measured by TPD-MS analysis to obtain a detection chart for a molecular weight (m/z) of 44. The value of high-temperature peak intensity/low-temperature peak intensity was 0.4. In addition, the ratio (low-temperature peak intensity ratio) of the difference between the minimum ionic strength and the maximum ionic strength in a range of 200 to 400° C. of the nitride phosphor of Comparative Example 2-2 with respect to the difference between the minimum ionic strength and the maximum ionic strength in a range of 200 to 400° C. of the nitride phosphor of Comparative Example 2-1 (which difference was defined as 1.0) was 0.3.

The relative brightness and the result of the reliability test are shown together in Table 10.

[Table 10]

TABLE 10

| | Heating treatment | | | | | Detection chart for molecular weight (m/z) of 44 | | Semiconductor light-emitting device | |
|---|---|---|---|---|---|---|---|---|---|
| | Atmosphere in heating furnace | | | | | | Low-temperature | | |
| | Oxygen content (ppm) | Water content (% by volume) | Feed gas | Heating temperature (° C.) | Heating time (h) | Value of high-temperature peak intensity/low-temperature peak intensity | peak intensity ratio | Relative brightness (%) | Reliability (Δy) |
| Example 2-1 | 3 | 0 | nitrogen | 900 | 12 | 1.4 | 0.1 | 137 | −0.001 |
| Example 2-2 | 3 | 1.1 | | | | 6.2 | 0.1 | 143 | −0.001 |

TABLE 10-continued

| | Heating treatment | | | | | Detection chart for molecular weight (m/z) of 44 | | | |
|---|---|---|---|---|---|---|---|---|---|
| | Atmosphere in heating furnace | | | | | | Low-temperature | Relative | Semiconductor light-emitting |
| | Oxygen content (ppm) | Water content (% by volume) | Feed gas | Heating temperature (° C.) | Heating time (h) | Value of high-temperature peak intensity/low-temperature peak intensity | peak intensity ratio | brightness (%) | device Reliability (Δy) |
| Example 2-3 | 3 | 3.1 | | | | 1.8 | 0.1 | 132 | −0.001 |
| Comparative Example 2-1*[1] | — | — | — | — | — | 0.1 | 1.0 | 125 | 0.000 |
| Comparative Example 2-2*[2] | — | — | — | — | — | 0.4 | 0.3 | 144 | −0.004 |

*[1]The heating step was not performed.
*[2]In place of the heating step, saturated water vapor was supplied into the heating furnace to perform a vapor heat treatment at 158° C.

It is seen that, in all of Examples where the heating step was performed, the value of high-temperature peak intensity/low-temperature peak intensity was higher and the low-temperature peak intensity was lower than in Comparative Example 2-1. In association with this, both the relative brightness and the reliability were high. It is seen that, also as compared to Comparative Example 2-2, the value of high-temperature peak intensity/low-temperature peak intensity was higher and the low-temperature peak intensity was lower. The nitride phosphors of Examples were generally characterized by being highly reliable and, thereamong, the nitride phosphor of Example 2-2 where the water content was adjusted had good relative brightness that was substantially equivalent to that of the nitride phosphor of Comparative Example 2-2.

Examples 2-4 to 2-7 and Comparative Example 2-3

Nitride phosphors of Examples 2-4 to 2-7 and Comparative Example 2-3 were obtained in the same manner as in Example 2-1, except that, in the heating step, the oxygen concentration was changed to 3 ppm, 100 ppm, 1,000 ppm, 10,000 ppm or 100,000 ppm as shown in Table 11 and the retention time was changed to 1.2 hours.

XRD measurement was performed for the nitride phosphors of Examples 2-4 to 2-7 and Comparative Example 2-3. As a result, the thus obtained diffraction patterns each showed only $La_3Si_6N_{11}$ forming a tetragonal crystal, and it was thus confirmed that a crystal phase having the desired chemical composition was produced.

The relative brightness and the internal quantum efficiency are shown together in Table 11 and FIG. 5.

TABLE 11

| | Heating step | | | | Relative brightness (%) | Internal quantum efficiency (%) |
|---|---|---|---|---|---|---|
| | Oxygen content in atmosphere (ppm) | Feed gas | Heating temperature (° C.) | Heating time (h) | | |
| Example 2-4 | 3 | nitrogen | 900 | 1.2 | 143 | 92 |
| Example 2-5 | 100 | | | | 137 | 91 |
| Example 2-6 | 1,000 | | | | 138 | 91 |
| Example 2-7 | 10,000 | | | | 133 | 90 |
| Comparative Example 2-3 | 100,000 | | | | 106 | 81 |

TABLE 11-continued

| | Heating step | | | | Relative brightness (%) | Internal quantum efficiency (%) |
|---|---|---|---|---|---|---|
| | Oxygen content in atmosphere (ppm) | Feed gas | Heating temperature (° C.) | Heating time (h) | | |
| Example 2-1*[1] | — | — | — | — | 128 | 90 |

*[1]The heating step was not performed.

In Examples 2-4 to 2-7 where the oxygen content was 10,000 ppm or less, the internal quantum efficiency was substantially equivalent or higher than in Comparative Example 2-3. On the other hand, in Comparative Example 2-3 where the oxygen content was 100,000 ppm, the internal quantum efficiency was drastically reduced, and it is believed that partial oxidation of the nitride phosphor resulted in such deterioration of the internal quantum efficiency. Therefore, the effect of the heat treatment can be preferably obtained at an oxygen concentration of 50,000 ppm or less, which is between the above-described oxygen concentration values and, in a range of 10,000 ppm or less, an effect substantially the same as the effect at a lower temperature can be preferably obtained.

Examples 2-8 to 2-14

Nitride phosphors of Examples 2-8 to 2-14 were obtained in the same manner as in Example 2-1, except that, in the heating step, the nitrogen gas was circulated through a water-filled bubbler in advance and thereby adjusted to have a water content of 1.1% by volume, 1.7% by volume, 2.2% by volume, 2.6% by volume, 3.1% by volume or 4.0% by volume as shown in Table 12 before being introduced into the heating furnace and the retention time was changed to 6 hours.

XRD measurement was performed for the nitride phosphors of Examples 2-8 to 2-14. As a result, the thus obtained diffraction patterns each showed only $La_3Si_6N_{11}$ forming a tetragonal crystal, and it was thus confirmed that a crystal phase having the desired chemical composition was produced.

The relative brightness values of these nitride phosphors based on the nitride phosphor of Comparative Example 2-1 are shown together in Table 12 and FIG. 6.

TABLE 12

| | Heating step | | | Relative brightness (%) |
|---|---|---|---|---|
| | Water content in atmosphere (% by volume) | Feed gas | Heating temperature (° C.) | |
| Example 2-8 | 0 | nitrogen | 900 | 116 |
| Example 2-9 | 1.1 | | | 117 |
| Example 2-10 | 1.7 | | | 118 |
| Example 2-11 | 2.2 | | | 119 |
| Example 2-12 | 2.6 | | | 119 |
| Example 2-13 | 3.1 | | | 116 |
| Example 2-14 | 4.0 | | | 114 |
| Comparative Example 2-1*[1] | — | — | — | 100 |

*[1]The heating step was not performed.

It is seen that, as compared to Comparative Example 2-1, the relative brightness was clearly higher and more preferable in Examples 2-8 to 2-14. Particularly, the water content is preferably higher than 0% by volume, more preferably 1.1% by volume or higher, but preferably 4.0% by volume or less, more preferably 3.0% by volume or less.

Examples 2-15 to 2-19

Nitride phosphors of Examples 2-15 to 2-19 were obtained in the same manner as in Example 2-1, except that, in the heating step, the introduced gas was changed or the inside of the heating furnace was evacuated to vacuum, the retention time was changed to 2 hours, and the heating temperature was adjusted as shown in Table 13. It is noted here that, because of the purity of the helium gas used and the vacuum condition, the oxygen content was 10,000 ppm or less and the water content was 10.0% by volume or less in the heating furnace.

XRD measurement was performed for the nitride phosphors of Examples 2-15 to 2-19. As a result, the thus obtained diffraction patterns each showed only $La_3Si_6N_{11}$ forming a tetragonal crystal, and it was thus confirmed that a crystal phase having the desired chemical composition was produced.

The internal quantum efficiency and the relative emission efficiency of semiconductor light-emitting devices against Comparative Example 2-1 as well as the results of the reliability test are shown together in Table 13.

TABLE 13

| | Heating step | | Internal quantum efficiency (%) | Semiconductor light-emitting device | |
|---|---|---|---|---|---|
| | Feed gas | Temperature (° C.) | | Relative emission efficiency (%) | Reliability (Δy) |
| Example 2-15 | helium | 1,000 | 92 | 108 | −0.001 |
| Example 2-16 | nitrogen | 500 | 91 | 105 | −0.002 |
| Example 2-17 | | 700 | 92 | 108 | −0.001 |
| Example 2-18 | | 1,000 | 92 | 109 | −0.001 |
| Example 2-19 | vacuum | 1,100 | 91 | 108 | −0.001 |
| Comparative Example 2-1*[1] | — | — | 90 | 100 | 0.000 |
| Comparative Example 2-2*[2] | — | — | 91 | 108 | −0.004 |

*[1]The heating step was not performed.
*[2]In place of the heating step, saturated water vapor was supplied into the heating furnace to perform a vapor heat treatment at 158° C.

In Examples 2-15 and 2-19, the relative emission efficiency was higher than in Comparative Example 2-1. Further, as compared to Comparative Example 2-2, the emission efficiency was equivalent and the reliability was higher. Therefore, the use of helium gas or vacuum as the introduced gas was confirmed to have the same effects as the use of a nitrogen gas whose oxygen content and water content are adjusted.

As compared to Comparative Example 2-2, the reliability was higher and more preferable in Examples 2-16 to 2-18. Further, in Examples 2-17 and 2-18, the relative emission efficiency was equivalent, and it is thus seen that a heat treatment temperature of 700° C. or higher is more preferred.

Examples 2-20 to 2-27

Nitride phosphors of Examples 2-20 to 2-27 were obtained in the same manner as in Example 2-1, except that, in the heating step, the heating temperature was changed to 500° C., 700° C., 750° C., 800° C., 850° C., 900° C., 950° C. or 1,000° C. as shown in Table 14 and the retention time was changed to 2 hours.

XRD measurement was performed for the nitride phosphors of Examples 2-20 to 2-27. As a result, the thus obtained diffraction patterns each showed only $La_3Si_6N_{11}$ forming a tetragonal crystal, and it was thus confirmed that a crystal phase having the desired chemical composition was produced.

The relative brightness values of these nitride phosphors based on the nitride phosphor of Comparative Example 2-1 are shown together in Table 14 and FIG. 7.

TABLE 14

| | Heating step | | | |
|---|---|---|---|---|
| | Oxygen content in atmosphere (ppm) | Feed gas | Heating temperature (° C.) | Relative brightness (%) |
| Example 2-20 | 3 | nitrogen | 500 | 112 |
| Example 2-21 | | | 700 | 115 |
| Example 2-22 | | | 750 | 117 |
| Example 2-23 | | | 800 | 118 |

TABLE 14-continued

| | Heating step | | |
|---|---|---|---|
| | Oxygen content in atmosphere (ppm) | Feed gas | Heating temperature (° C.) | Relative brightness (%) |
|---|---|---|---|---|
| Example 2-24 | | | 850 | 118 |
| Example 2-25 | | | 900 | 118 |
| Example 2-26 | | | 950 | 114 |
| Example 2-27 | | | 1,000 | 116 |
| Comparative Example 2-1*[1] | — | — | — | 110 |
| Comparative Example 2-2*[2] | — | — | — | 116 |

*[1]The heating step was not performed.
*[2]In place of the heating step, saturated water vapor was supplied into the heating furnace to perform a vapor heat treatment at 158° C.

In Examples 2-20 to 2-27 where the heat treatment temperature was 500° C. to 1,000° C., the relative brightness was clearly higher than in Comparative Example 2-1.

Example 2-28

A nitride phosphor of Example 2-28 was obtained in the same manner as in Example 2-1, except that the retention time in the heating step was changed to 6 hours.

XRD measurement was performed for the nitride phosphor of Examples 2-28. As a result, the thus obtained diffraction pattern showed only $La_3Si_6N_{11}$ forming a tetragonal crystal, and it was thus confirmed that a crystal phase having the desired chemical composition was produced.

Examples 2-29 to 2-31

The fired product obtained through the above-described washing step of Example 2-1 was charged to a boron nitride (BN) crucible, and this crucible was placed in an electric furnace. Subsequently, as a pretreatment of the heating step, a heat treatment was performed in an atmosphere having a higher oxygen content than the atmosphere used in the heating step. Specifically, in the atmosphere, the furnace temperature was raised to the temperature shown in Table 15 (700° C., 800° C. or 900° C.), retained for 6 hours and then cooled, after which the thus pretreated fired product was taken out of the furnace.

Thereafter, this pretreated fired product was maintained at 900° C. for 6 hours to perform the heating step in the same manner as in Example 2-28, whereby nitride phosphors of Examples 2-29 to 2-31 were obtained.

XRD measurement was performed for the nitride phosphors of Examples 2-29 to 2-31. As a result, the thus obtained diffraction patterns each showed only $La_3Si_6N_{11}$ forming a tetragonal crystal, and it was thus confirmed that a crystal phase having the desired chemical composition was produced.

With regard to the nitride phosphors of Examples 2-28 to 2-31, the relative brightness values based on the nitride phosphor of Comparative Example 2-1 are shown together in Table 15 and FIG. 8.

TABLE 15

| | Pretreatment | | | | Heating step | | | | |
|---|---|---|---|---|---|---|---|---|---|
| | Oxygen concentration in atmosphere (%) | Feed gas | Heating temperature (° C.) | Heating time (h) | Oxygen content in atmosphere (ppm) | Feed gas | Heating temperature (° C.) | Heating time (h) | Relative brightness (%) |
| Example 2-28*[1] | — | — | — | — | 3 | nitrogen | 900 | 6 | 140 |
| Example 2-29 | 21 | air | 700 | 6 | 3 | | | | 146 |
| Example 2-30 | | | 800 | | 3 | | | | 144 |
| Example 2-31 | | | 900 | | 3 | | | | 142 |
| Comparative Example 2-1*[2] | — | — | — | — | — | — | — | — | 124 |

*[1]The pretreatment was not performed.
*[2]Neither the pretreatment nor the heating step was performed.

The nitride phosphors of Examples 2-28 to 2-31 exhibited higher relative brightness than the nitride phosphor of Comparative Example 2-1. It was thus found that, by performing a pretreatment prior to the heating step, a favorable nitride phosphor that exhibits the same level of relative brightness as in Example 2-2 where a heat treatment was performed in an atmosphere having an appropriate water content, i.e. under a relatively weakly reducing to weakly oxidizing condition, can be obtained.

The invention claimed is:
1. A nitride phosphor having two or more maximum absorption points in a range of 3,200 to 3,300 cm$^{-1}$ in an infrared absorption (FT-IR) spectrum, and comprising:
a crystal phase having a chemical composition represented by the following Formula (1):

$$M1_xM2_yM3_z: M4 \qquad (1)$$

wherein
M1 represents at least one element selected from the group consisting of Y, La, Gd and Lu;
M2 represents at least one element selected from the group consisting of Ge, Si, Hf, Zr, Al, Ga and Ti;

M3 comprises N as an essential element and represents at least one element selected from the group consisting of N, O, F and Cl;

M4 represents at least one activation element selected from the group consisting of Eu, Ce, Pr, Cr, Nd, Sm, Tb, Dy, Ho, Er, Tm, Yb and Mn;

x satisfies $2.0 \leq x \leq 4.0$;

y satisfies $5.0 \leq y \leq 7.0$; and z satisfies $10.0 \leq z \leq 12.0$.

2. The nitride phosphor according to claim 1, having a maximum absorption point in two or more ranges of 3,220 to 3,250 $cm^{-1}$, 3,255 to 3,275 $cm^{-1}$, and 3,280 to 3,300 $cm^{-1}$.

3. The nitride phosphor according to claim 1, wherein in Formula (1), M1 is at least one element selected from the group consisting of Y, La and Gd, and M2 comprises Si as an essential element.

4. The nitride phosphor according to claim 1, wherein in Formula (1), x satisfies $2.7 \leq x \leq 3.3$, and y satisfies $5.4 \leq y \leq 6.6$.

5. The nitride phosphor according to claim 1, having a maximum absorption point in a range of 3,720 to 3,760 $cm^{-1}$ in the infrared absorption (FT-IR) spectrum.

6. The nitride phosphor according to claim 1, wherein the crystal phase that has the chemical composition represented by Formula (1) is a tetragonal crystal.

7. A nitride phosphor comprising a crystal phase that has a chemical composition represented by the following Formula (2), wherein when the value of a difference between a minimum ionic strength and a maximum ionic strength in a range of 200 to 400° C. in a detection chart for a molecular weight (m/z) of 44 measured by TPD-MS analysis is defined as 1, the value of a difference between a minimum ionic strength and a maximum ionic strength in a range of 500 to 650° C. is 0.5 or larger:

$$M_pSi_qN_r\cdot Z \qquad (2)$$

wherein

M represents a rare-earth element, excluding an element used as an activator;

Z represents the activator;

p satisfies $2.7 \leq p \leq 3.3$;

q satisfies $5.4 \leq q \leq 6.6$; and r satisfies $10 \leq r \leq 12$.

8. The nitride phosphor according to claim 7, wherein the value of the difference between the minimum ionic strength and the maximum ionic strength in the range of 500 to 650° C. is 2.0 or larger.

9. The nitride phosphor according to claim 7, wherein in Formula (2), M is at least one element selected from the group consisting of La, Y, Gd and Lu.

10. The nitride phosphor according to claim 7, wherein the crystal phase that has the chemical composition represented by Formula (2) is a tetragonal crystal.

11. A method of producing a nitride phosphor comprising a crystal phase that has a chemical composition represented by the following Formula (2), wherein the method comprises:

preparing a raw material mixture of the nitride phosphor comprising the crystal phase that has the chemical composition represented by the following Formula (2);

firing the raw material mixture; and heating a fired product obtained by the firing step in an atmosphere having an oxygen content of 10,000 ppm or less, wherein the crystal phase is a tetragonal crystal or an orthorhombic crystal:

$$M_pSi_qN_r\cdot Z \qquad (2)$$

wherein

M represents a rare-earth element, excluding an element used as an activator;

Z represents the activator;

p satisfies $2.7 \leq p \leq 3.3$;

q satisfies $5.4 \leq q \leq 6.6$; and r satisfies $10 \leq r \leq 12$.

12. The method according to claim 11, wherein the heating of the fired product is in an atmosphere having a water content of 10.0% by volume or less.

13. The method according to claim 11, wherein the atmosphere having an oxygen content of 10,000 ppm or less is realized by supplying a nitrogen gas and/or a noble gas into a heating furnace where heating is performed.

14. The method according to claim 11, wherein the heating of the fired product is at 500° C. to 1,300° C.

15. A light-emitting device comprising:

a semiconductor light-emitting element that emits a UV light or a visible light; and the nitride phosphor according to claim 1.

16. A lighting apparatus comprising the light-emitting device according to claim 15 as a light source.

17. An image display device comprising the light-emitting device according to claim 15 as a light source.

18. A light-emitting device comprising:

a semiconductor light-emitting element that emits a UV light or a visible light; and the nitride phosphor according to claim 7.

19. A lighting apparatus comprising the light-emitting device according to claim 18 as a light source.

20. An image display device comprising the light-emitting device according to claim 18 as a light source.

* * * * *

UNITED STATES PATENT AND TRADEMARK OFFICE
CERTIFICATE OF CORRECTION

PATENT NO. : 11,279,875 B2
APPLICATION NO. : 16/743100
DATED : March 22, 2022
INVENTOR(S) : Koizumi et al.

It is certified that error appears in the above-identified patent and that said Letters Patent is hereby corrected as shown below:

In the Claims

Column 51, Claim 7, Line 37:
"$M_pSi_qN_r.Z$     (2)"
Should read:
-- $M_pSi_qN_r:Z$     (2) --.

Column 52, Claim 11, Line 18:
"$M_pSi_qN_r.Z$     (2)"
Should read:
-- $M_pSi_qN_r:Z$     (2) --.

Signed and Sealed this
Twelfth Day of July, 2022

Katherine Kelly Vidal
*Director of the United States Patent and Trademark Office*